(12) United States Patent
Pedersen et al.

(10) Patent No.: US 7,388,530 B2
(45) Date of Patent: Jun. 17, 2008

(54) A/D-CONVERTER

(75) Inventors: Kim Rishøj Pedersen, Egå (DK); Lars Arknæs-Pedersen, Viby J (DK)

(73) Assignee: TC Electronic A/S (DK)

( * ) Notice: Subject to any disclaimer, the term of this patent is extended or adjusted under 35 U.S.C. 154(b) by 0 days.

(21) Appl. No.: 10/573,053

(22) PCT Filed: Sep. 22, 2004

(86) PCT No.: PCT/DK2004/000643

§ 371 (c)(1),
(2), (4) Date: Mar. 22, 2006

(87) PCT Pub. No.: WO2005/029708

PCT Pub. Date: Mar. 31, 2005

(65) Prior Publication Data

US 2007/0085717 A1    Apr. 19, 2007

(30) Foreign Application Priority Data

Sep. 22, 2003   (DK) .................... PCT/DK03/00613

(51) Int. Cl.
*H03M 3/00* (2006.01)
(52) U.S. Cl. ............. 341/143; 341/155; 341/157
(58) Field of Classification Search ............ 341/143, 341/118, 120, 155, 157; 375/259, 376
See application file for complete search history.

(56) References Cited

U.S. PATENT DOCUMENTS

| | | | | |
|---|---|---|---|---|
| 4,123,709 A | * | 10/1978 | Dodds et al. ............. | 375/249 |
| 4,695,742 A | * | 9/1987 | Randall ..................... | 327/101 |
| 5,204,635 A | | 4/1993 | Takeuchi | |
| 5,323,156 A | * | 6/1994 | Budmiger ................. | 341/143 |
| 5,729,230 A | * | 3/1998 | Jensen et al. ............. | 341/143 |
| 5,834,987 A | * | 11/1998 | Dent ........................ | 332/127 |
| 6,232,902 B1 | * | 5/2001 | Wada ....................... | 341/143 |
| 6,664,908 B2 | * | 12/2003 | Sundquist et al. ........ | 341/143 |
| 6,674,387 B1 | | 1/2004 | Ott | |
| 6,950,488 B2 | * | 9/2005 | Chung et al. ............. | 375/376 |
| 6,965,339 B2 | * | 11/2005 | Midya et al. ............. | 341/163 |
| 7,042,377 B2 | * | 5/2006 | Oliaei ...................... | 341/143 |
| 7,084,799 B1 | * | 8/2006 | Butler ...................... | 341/143 |

(Continued)

FOREIGN PATENT DOCUMENTS

| | | |
|---|---|---|
| DE | 36 42 360 | 6/1988 |
| DE | 101 28 942 | 1/2003 |
| WO | WO 02/25357 | 3/2002 |
| WO | WO 2005/029707 | 3/2005 |

OTHER PUBLICATIONS

International Search Report; PCT/DK2004/000643; Jan. 13, 2005.
Faramarz Sabouri et al.; "A High-Performance Calibration-Free Charge-Balancing Analog-to-Digital Converter"; IEEE Transactions on Instrumentation and Measurement, vol. 45, No. 5, Oct. 1996; XP000631687.

*Primary Examiner*—Linh V Nguyen
(74) *Attorney, Agent, or Firm*—Cantor Colburn LLP

(57) ABSTRACT

The invention relates to at least one self-oscillating loop (SOL) comprising at least one forward path (FP), at least one feedback path (FBP) wherein said at least one forward path (FP) comprises amplitude quantizing means (AQM) combined with time quantizing means (TQM) and outputting at least one time and amplitude quantized signal (OS). According to the invention, a high-speed high-resolution A/D converter may be obtained.

49 Claims, 27 Drawing Sheets

U.S. PATENT DOCUMENTS 7,142,142 B2 * 11/2006 Petersen et al. ............ 341/143
7,142,606 B2 * 11/2006 Talwalkar et al. .......... 375/259
7,183,957 B1 * 2/2007 Melanson ................... 341/143
2001/0043153 A1 * 11/2001 Gordon et al. .............. 341/143

* cited by examiner

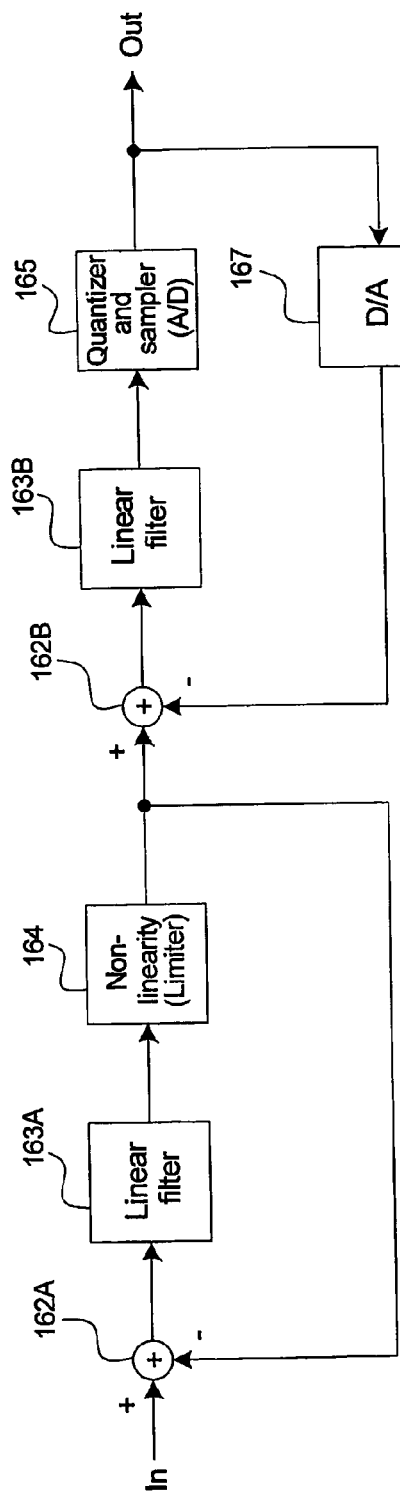
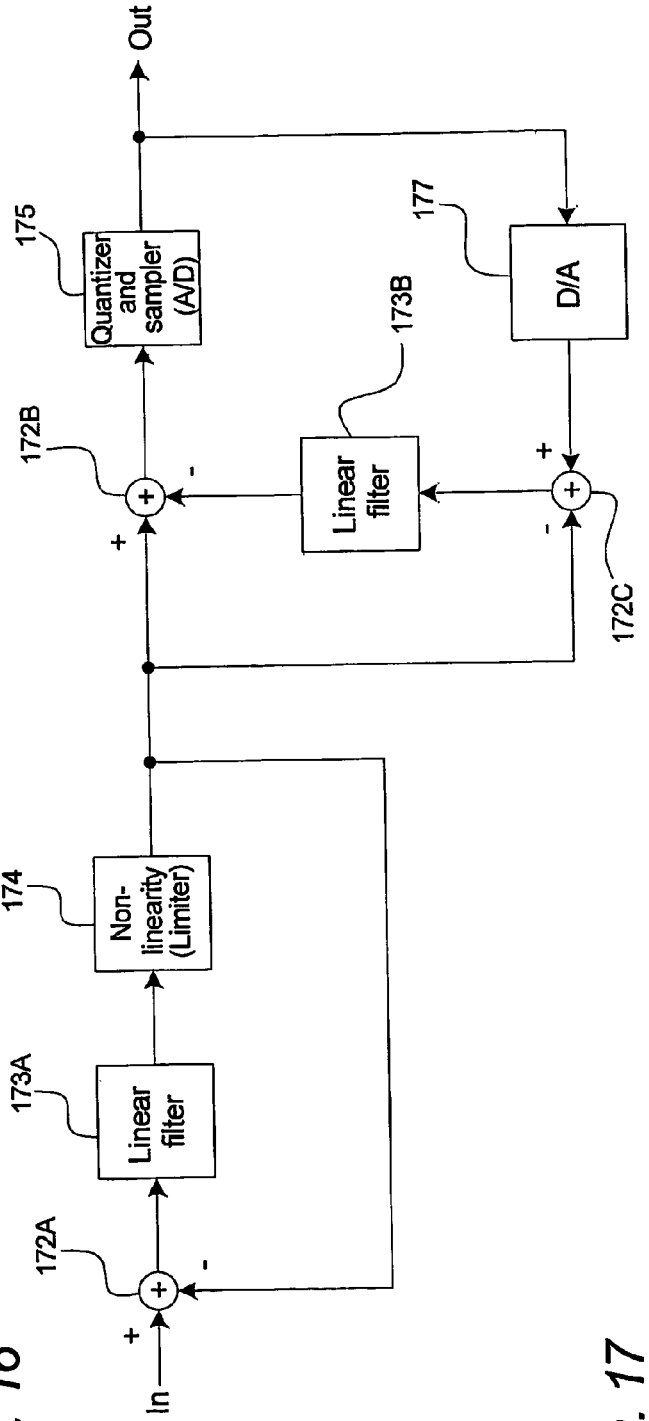
Fig. 16
Fig. 17

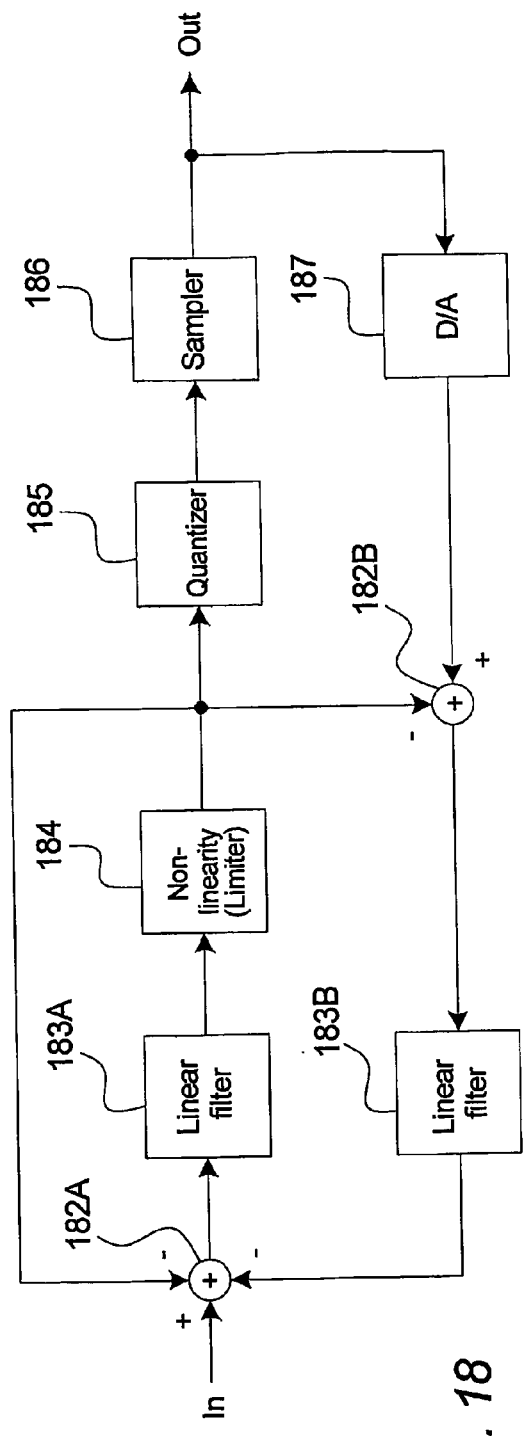
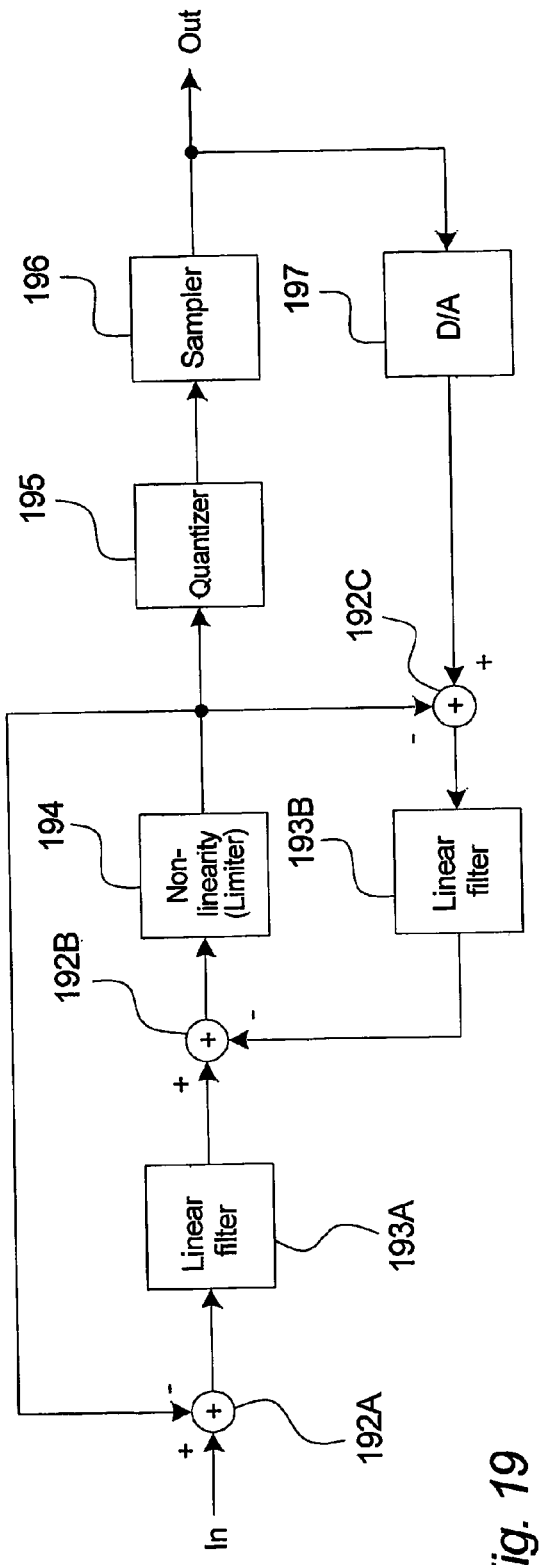
Fig. 18
Fig. 19

A/D-CONVERTER

CROSS-REFERENCE TO RELATED APPLICATION

This application is related to and claims the benefit of International Patent Application No. PCT/DK2003/00613 filed on 22 Sep. 2003 designating the United States of America, said application being incorporated herein by reference in its entirety.

FIELD OF THE INVENTION

The invention relates to an A/D-converter according to the independent claim 1

DESCRIPTION OF THE RELATED ART

Over the recent years, so-called self-oscillating modulators have become the object of extensive research. Self-oscillating modulators have among many names been referred to in the art as controlled oscillating modulators. The use of such self-oscillating modulators have, however, been relatively limited due to the fact that performance of the modulators has been somehow restricted, thereby reducing the potential market to low-end applications. Others refer to self-oscillating modulators as controlled oscillating modulators.

BRIEF SUMMARY OF THE INVENTION

The invention relates to an A/D converter comprising a self-oscillating modulator, said converter comprising at least one self-oscillating loop again comprising at least one forward path and at least one feedback path, wherein said at least one forward path comprises amplitude quantizing means combined with time quantizing means and outputting at least one time and amplitude quantized signal.

According to the invention, a high-speed high resolution A/D converter may be obtained due to the fact that an advantageous pulse width modulation is facilitated by the at least one self-oscillating loop. It should be noted that the forward path FP broadly refers to a forward path, e.g. not only including the forward path of a closed feedback loop. Thus, e.g. time quantizing means may be cascaded with amplitude quantizing means externally to the loop.

According to the invention, a combined amplitude and time quantized signal is understood as a hybrid representation partly established as the traditional amplitude quantizing combined with a further quantizing in the time domain. This quantizing may also be referred to as a two-dimensional quantizing. In this context it should be noted that an amplitude quantized signal may also include a PWM two-level signal in the sense that the two levels may be regarded as two amplitude quantized levels suitable for establishment of the desired value when combined with a time-quantized signal.

According to a preferred embodiment of the invention, the time-quantization should divide the time axis over a PWM-period in at least 10, preferably at least 100 time-subintervals.

In a preferred embodiment of the invention, said time quantizing means is arranged within said self-oscillating loop.

According to a preferred embodiment of the invention, said time and amplitude quantizing means are included in the feedback loop of a least one self-oscillating loop. In this way, the accuracy of the time quantizing may be improved significantly in a given frequency band compared to what in fact should be expected based on the known properties of an available time quantizer, such as a one-bit sampler. Thus, the available time resolution in the time domain may in fact be improved significantly in the sense that the self-oscillating loop suppresses both intrinsic noise and even quantizing noise when the time quantizer is included in the forward path of a self-oscillating loop. An example of the above-described circuit is illustrated in FIG. 8a.

In an embodiment of the invention, said time quantizing means comprises a high-speed sampling means.

According to a preferred embodiment of the invention, the time quantizing means comprises an e.g. 50-200 MHz sampler although higher frequencies may of course be applied. Evidently, according to the invention, a high time-resolution is preferred in order to increase the effective resolution as much as possible.

In an embodiment of the invention, said time quantizing means comprises a high-speed one-bit sampler.

According to a preferred embodiment of the invention, a high-speed one-bit sampler may comprise e.g. a simple latch sampling e.g. at a frequency of 50 to 200 MHz.

In an embodiment of the invention said time quantizing means comprises latch-based circuitry comprising at least one latch, preferably at least two cascaded latches.

It has been recognized that a time quantizer comprising at least two cascaded latches improves the desired performance of the time-quantizer by avoiding non-defined regions.

In an embodiment of the invention, said amplitude quantizing means and said time quantizing means comprises a multi-bit A/D converter and where said feedback path comprises at least one D/A converter adapted for converting said time quantized signal into an analogue signal.

According to an embodiment of the invention, the time-quantized output signal may be established by multi-bit A/D converter. In this way a more detailed digitized expression of the analogue signal may be established. Moreover, in order to facilitate the self-oscillating properties of loop, this multi-bit representation may of course be converted into an analogue signal, which may be fed back to the input of the forward path.

In an embodiment of the invention said down sampling means are connected to said time quantizing means.

According to an embodiment of the invention, said down sampling means may both be directly coupled to said time quantizing and coupled via further circuitry.

In an embodiment of the invention said A/D converter comprises two or more self-oscillating loops (SOL).

According to an embodiment of the invention, multiple self-oscillating may be applied e.g. for improvement of noise suppression, etc.

In an embodiment of the invention said amplitude time quantizing means comprises an analogue two-level self-oscillating pulse width modulator.

In an embodiment of the invention said amplitude time quantizing means comprises a multi-level self-oscillating pulse width modulator.

In an embodiment of the invention said A/D converter is single-ended.

In an embodiment of the invention said A/D converter is differential.

In an embodiment of the invention said A/D converter comprises filtering means, said filtering means adapted for band pass filtering the time quantized signal.

In an embodiment of the invention the error originating from at least one time quantizer included in the at least one self-oscillating loop of the converter is suppressed by an error transfer function which, at low frequencies approximates the inverse of the open-loop transfer function of said at least one self-oscillating loop.

According to the specific context of the invention, low frequencies may be regarded as frequencies well below the switch frequency. A precondition for obtaining the desired noise transfer function is that $|H(S)|\gg 1$ at low frequencies and at least on the utility band.

In an embodiment of the invention the error originating from at least one time quantizer included in the at least one self-oscillating loop of the converter is suppressed by an error transfer function which, at high frequencies approximates 0 dB.

According to the specific context of the invention, high frequencies may be regarded as frequencies significantly above the switch frequency.

In an embodiment of the invention said amplitude quantizing means comprises a limiter.

According to an embodiment of the invention several different limiters nay be applied for the purpose of obtaining the desired combination of modulation and oscillation.

In an embodiment of the invention said amplitude quantizing means comprises a frequency compensated limiter.

According to an advantageous embodiment frequency compensation may be applied. In this context, frequency compensation is regarded as a compensation inserted in the self-oscillating loop(s) or simple affecting the self-oscillation loop(s) to maintain a steady switch frequency.

In an embodiment of the invention a variable self-oscillating loop delay is applied.

By applying a variable delay in the self-oscillating loop a steady switch oscillation frequency may be obtained.

In an embodiment of the invention a variable delay in the feedback path.

By applying a variable delay in the feedback path a steady switch oscillation frequency may be obtained.

In an embodiment of the invention a transfer function H(s) is inserted in the forward path, thereby at least partly controlling the switch-frequency.

Evidently, according to further embodiments of the invention, further filters may be applied, e.g. forming path of at least one feed-back path of the self-oscillating circuitry.

Moreover, the invention relates to a method of performing a A/D-conversion comprising the steps of representing a pulse width modulated representation as an analogue signal and quantizing the pulse width modulation in the time-domain.

In an embodiment of the invention, said pulse width modulated representation is obtained by means of at least one self-oscillating modulator comprising at least one self-oscillating loop.

In an embodiment of the invention, said quantization in the time domain is performed within said at least one self-oscillating loop.

In an embodiment of the invention the A/D converter switches with a switch frequency which is at least partly defined by the at least one self oscillating loop.

In an embodiment of the invention the switch frequency is at least 200 kHz, preferably at least 300 kHz.

A high switch frequency of the modulator may thus facilitate an efficient and highly accurate modulation of the input signal.

In an embodiment of the invention said A/D converter comprises switch frequency control means.

According to an embodiment of the invention, an active control of the switch frequency may be preferred in order to avoid different disadvantages of the "floating" switch frequency of a non-fixed switch frequency application of the invention. Frequency control means may thus be applied for minimizing of undesired interference between different modulators, e.g. of neighboring channels.

In an embodiment of the invention said switch frequency control means comprises a variable delay in said at least one self oscillating loop.

According to an embodiment of the invention, a substantially fixed switching frequency may be obtained by means of a variable loop delay. The delay may e.g. be varied according to a runtime monitoring of the switch frequency in the self-oscillating loop.

In an embodiment of the invention said switch frequency control means comprises an additional periodic signal generator connected to the self oscillating loop.

According to an embodiment of the invention, a substantially fixed switching frequency may be obtained by means of an additional periodic signal generator. This signal may thus e.g. be added immediately prior to the non-linearity and thereby trig each period of some periods of the overlaying switch frequency.

In an embodiment of the invention said switch frequency control means comprises an oscillator.

In an embodiment of the invention said at least one forward path comprises a non-linearity.

According to an embodiment of the invention, a practical way of obtaining the overlying oscillation frequency may be to include a non-linearity in the forward path.

In an embodiment of the invention said non-linearity comprises a limiter.

According to an embodiment of the invention, such non-linearity may comprise a limiter, e.g. a substantially linear limiter.

In an embodiment of the invention said non-linearity comprises a frequency compensated limiter.

In an embodiment of the invention comprises a comparator.

In an embodiment of the invention said non-linearity comprises a operational amplifier.

As noted above, several different types of well-known non-linearities may be applied for the purpose of obtaining the self-oscillating properties. Evidently, other types of non-linearities may be applied within the scope of the invention.

In an embodiment of the invention the phase contribution of hysteresis in the non-linearity of the self-oscillating loop is less than 90°, preferably less than 40° at the switch frequency.

According to an preferred embodiment of the invention, a hysteresis associated to the non-linearity of the at least one self-oscillating loop should be less than 90°, preferable less than 80° thereby avoiding significant restrictions to the loop filter characteristics.

In an embodiment of the invention the phase contribution of hysteresis in the non-linearity of the self-oscillating loop at the switch frequency is less than 20°, preferably less than 10°.

When minimizing the contribution of hysteresis in the non-linearity of the self-oscillating loop to less than 20°, preferably less than 10°, an effective error suppression provided by the self-oscillating loop may be obtained due to the fact that the order and specifically the effective order of the loop filter may be increased.

According to an embodiment of the invention, a hysteresis as low as about 0° (zero degrees) may be preferred. Such an embodiment would facilitate very high noise suppression by the loop filter of the self-oscillating loop. Such low hysteresis may advantageously be supplemented by a digital compensation for bouncing in the pulse width modulator. Such digital compensation may preferable be comprised within the self-oscillating loop, thereby facilitating suppression of errors introduced by the digital circuit.

In an embodiment of the invention said at least one forward path and said at least one feedback path forms at least one self-oscillating loop.

In an embodiment of the invention said self-oscillating loop forms a pulse width modulator and wherein the modulation of an analog input signal fed to the at least one forward path is pulse width modulated at least partly by oscillations established in said at least one self-oscillating loop.

In an embodiment of the invention said self-oscillating comprises at least one analog input connected to said forward path and wherein the output of said forward path is connected to a digital output.

In an embodiment of the invention a transfer function H(s) is inserted in the forward path, thereby at least partly controlling the switch-frequency.

In an embodiment of the invention the order of said transfer function is at least one.

According to an embodiment of the invention, the transfer function, i.e. basically the loop-filter or at least the switch frequency determining part of it should have an effective order greater than one in order to obtain an efficient suppression of noise in the forward path.

In an embodiment of the invention the order of said transfer function is at least two.

According to an embodiment of the invention, the transfer function, i.e. basically the loop-filter or at least the switch frequency determining part of it should have an order greater than two in order to obtain a possibility of fitting the desired amplitude characteristic of a complete loop filter of a self-oscillating loop to the available phase shift about 180°

In an embodiment of the invention the effective order of said transfer function is at least one, preferably substantially two.

According to a preferred embodiment of the invention, the transfer function, i.e. basically the loop-filter or at least the switch frequency determining part of it should have an effective order greater than one and as close as possible to two in order to obtain an efficient suppression of noise in the feed-back circuit.

As earlier mentioned, such dimensioning of the switch frequency determining parts of the loop-filter(s) may be facilitated by keeping the hysterises of the non-linearity as low as possible.

It should be noted that the effective order of a filter basically refers to the slope of the amplitude characteristic below the switch frequency.

In an embodiment of the invention said A/D converter comprises an audio A/D-converter.

In an embodiment of the invention the clock frequency of the time quantizing means is at least 10 (ten) times greater than the switch frequency of said at least one self-oscillating loop, preferably at least 100 (hundred) times greater.

According to an embodiment of the invention, the clock frequency of the time quantizing means should preferable by significantly greater than the switch frequency.

In an embodiment of the invention said quantization in the time domain is performed within said at least one self-oscillating loop.

In an embodiment of the invention said A/D further comprises at least one decimator communicating with the digital output.

In an embodiment of the invention said decimator comprises an anti aliasing filter having an impulse response which longer that period of the pulse width modulated signal, preferably at least longer than three times the period of the pulse width modulated signal.

Moreover, the invention relates to a method of pulse width modulating an analog input signal into a pulse width modulated digital signal, whereby said analog input signal is modulated into a pulse width modulated representation by means of at least one self-oscillating loop said self-oscillating loop comprising
at least one forward path,
at least one feedback path, wherein said at least one forward path comprises amplitude quantizing means combined with time quantizing means and outputting at least one time and amplitude quantized signal, In an embodiment of the invention said analog signal comprises an audio or audio derived signal.

In an embodiment of the invention the method comprises the steps of representing a pulse width modulated representation as an analogue signal and quantizing the pulse width modulation in the time-domain and whereby said pulse width modulated representation is obtained by means of at least one self-oscillating modulator comprising at least one self-oscillating loop.

In an embodiment of the invention the A/D converter switches with a switch frequency which is at least partly defined by the at least one self oscillating loop.

A high switch frequency of the modulator may thus facilitate an efficient and highly accurate modulation of the input signal.

In an embodiment of the invention wherein said switch frequency is at least approximately 100 kHz, preferably at least 200 kHz and most preferably at least 300 kHz.

In an embodiment of the invention wherein the clock frequency of the time quantizing means is at least 10 (ten) times greater than the switch frequency of said at least one self-oscillating loop, preferably at least 100 (hundred) times greater.

In an embodiment of the invention said method is performed in an audio A/D converter.

In an embodiment of the invention, the stopband attenuation of the underlying antialiasing filter must be greater than 60 dB, preferably greater than 100 dB. The stopband for this type of antialiasing filter equals:

$$\text{Stopband} = k \cdot fs_{OUT} \pm BW$$

where k=1,2,3, . . . until the Nyquist frequency is reached, $fs_{OUT}$ is the output rate of the decimator and BW is the utility bandwidth, typically 20 kHz

BRIEF DESCRIPTION OF THE DRAWINGS

The invention will be described below with reference to the figures where

FIG. 16 illustrates an embodiment of the invention where the non-linearity is included in a self-oscillating loop and cascaded with a subsequent time and amplitude quantizer comprising a noise shaper, FIG. 17 illustrates an embodiment of the invention corresponding to FIG. 16 but where only the quantizing error resulting from the time quantizer is filtered, FIG. 18 illustrates a further embodiment of the invention where the time-quantizing error is fed back to the amplitude self-oscillating loop, FIG. 19 illustrates a further topology of feeding the time-quantizing error back to the amplitude self-oscillating loop.

DETAILED DESCRIPTION OF THE INVENTION

Self-oscillating modulators have found some use over the recent years, but the use of such modulation techniques has up until now been restricted to relatively few market segments.

Examples of such self-oscillating modulators are WO 00/42702, WO 02/25357, WO 02/093973, U.S. Pat. No. 6,118,336, WO 98/19391, WO 00/27028, U.S. Pat. No. 6,249,182 hereby included by reference with respect to different basic principles regarding the establishment and controlling of the desired oscillation in combination with the desired modulation. It is noted that according to the invention it is generally preferred to apply a relatively high switch frequency in order to obtain not only the desired oscillation but also very powerful noise suppression obtained by the broad banded feedback path(s) of the self-oscillating modulator.

Figure 1:
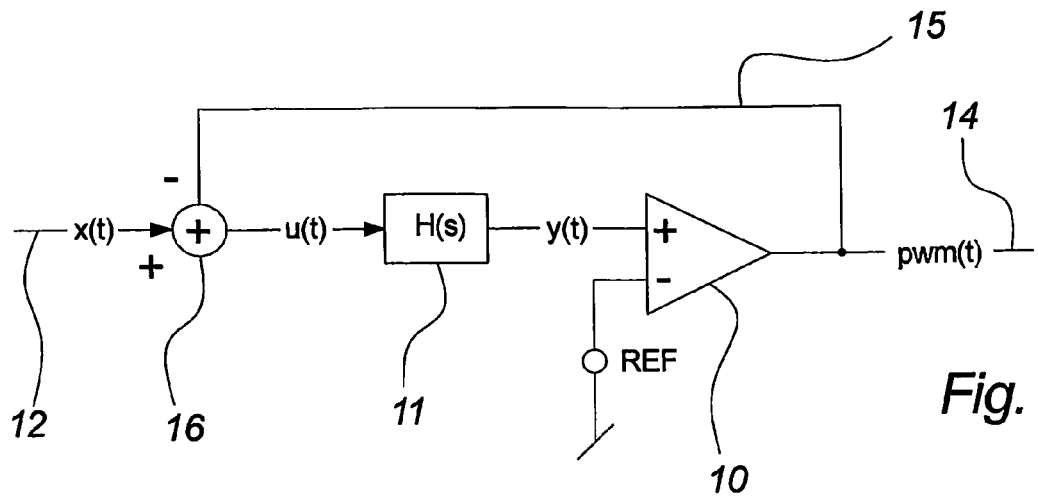
FIG. 1 illustrates a self-oscillating pulse width modulator.

FIG. 1 illustrates an example of such a self-oscillating pulse width modulator.

From the beginning it should be noted that PWM in this context covers several different types of variations, such as NPWM, LPWM, etc. The illustrated PWM modulator utilizes in a known way the very broad banded feedback as error attenuation combined with the PWM modulation of the input signal. Evidently, according to the invention, several other self-oscillating topologies may be applied within the scope of the invention with further signal paths. Basically, the illustrated circuit should rather be regarded as a principle model of a self-oscillating modulator.

The illustrated self-oscillating modulator comprises an input 12 guiding an input signal x(t) to a comparator 10 via a subtraction point 16 and compensating filtering means 11. The comparator 10 delivers an output pwm(t) on an output 14 of the circuit output. Moreover, this output is fed back to the subtraction point 16. The arranging of e.g. filtering means may be realized in several different ways, e.g. by inclusion of further filtering means e.g. in further (not shown) feedback or forward paths. Note that the illustrated embodiment features a comparator 10 having a variable voltage reference instead of a fixed grounding in order to keep the switch frequency within a certain desired switch-frequency interval independent or substantially independent of the frequencies of the input signal. The variable voltage reference may be established in many ways within the scope of the invention, e.g. on the basis of the amplitude of the input signal of the modulator. An example of one principle applied for this purpose is known from WO 00/42702, hereby included by reference.

Figure 2:
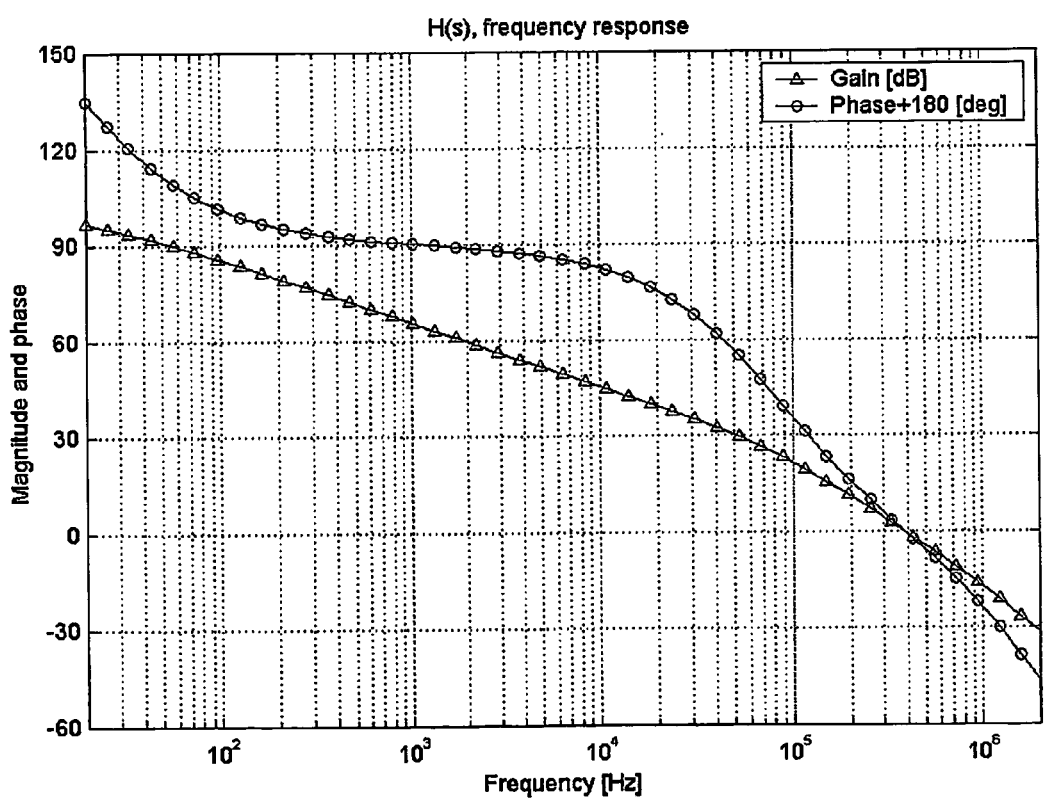
FIG. 2 illustrates filter characteristics of a pulse width modulator.

One way of looking at the modulator may be summed up: the open loop phase has to be approximately −180 degrees at the desired switch frequency. The comparator will provide the gain. An example of a suitable filter H(s) may be illustrated in FIG. 2 where the switch frequency is approximately 384 kHz.

Figure 3A:
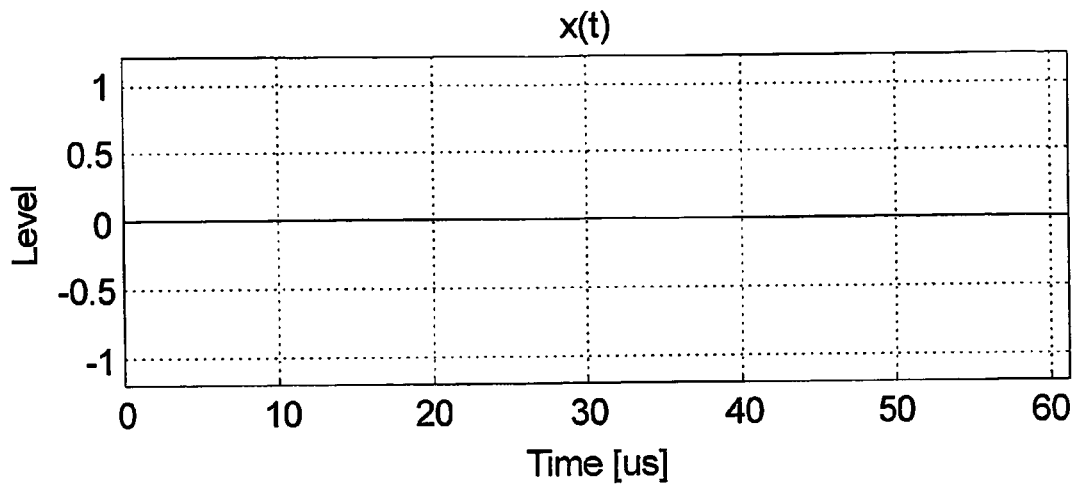
FIG. 3a and 3b illustrate a possible input and a resulting output of a pulse width modulator, respectively.
Figure 3B:
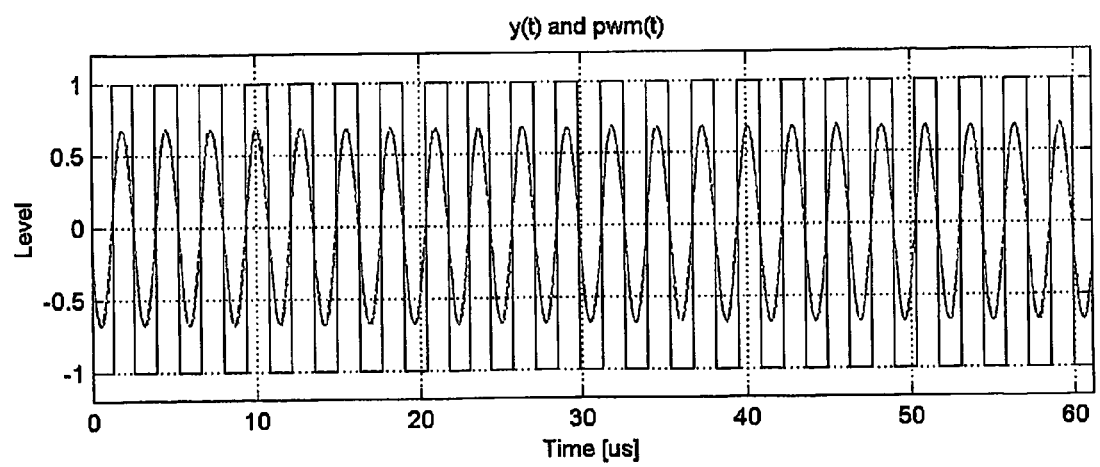

FIG. 3a and 3b illustrate a possible input and a resulting output of a PWM modulator, where FIG. 3a illustrates an exemplary input signal x(t)=0 and FIG. 3b illustrates the resulting output pwm(t) of the modulator.

Figure 4A:
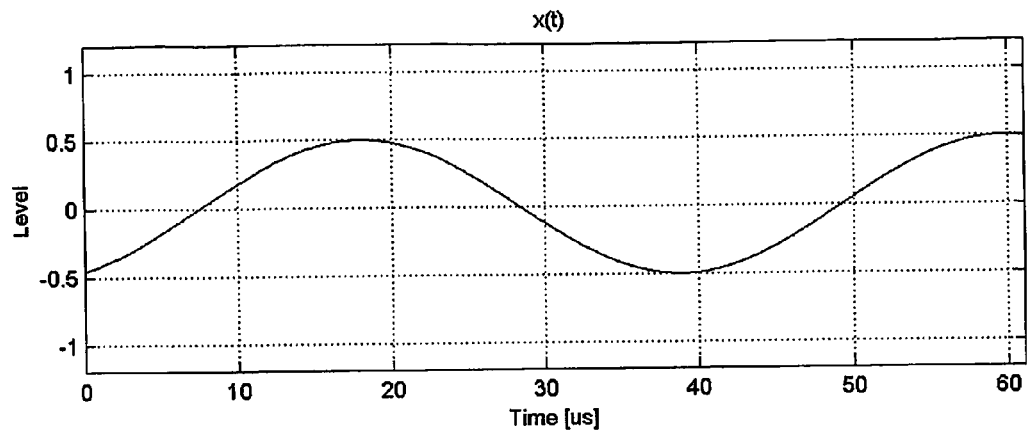
FIG. 4a and 4b illustrate a further possible input and a resulting output of a pulse width modulator, respectively.
Figure 4B:
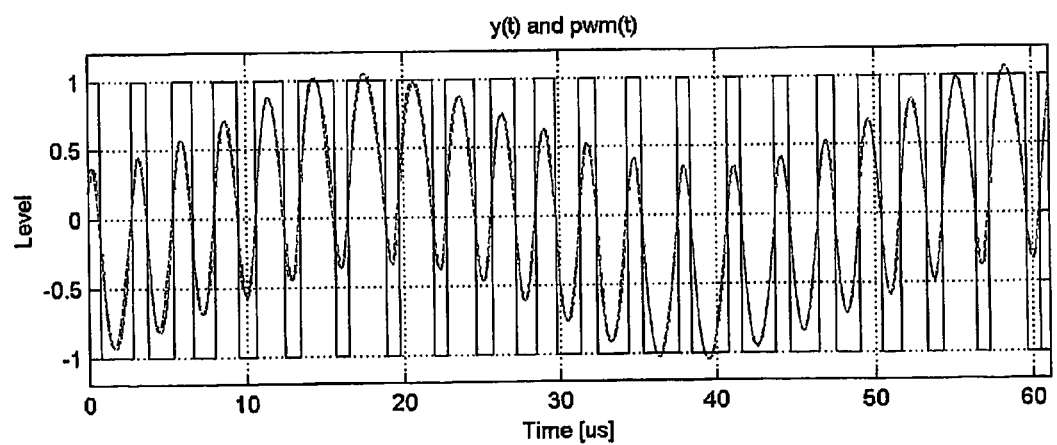

FIG. 4a and 4b illustrate a further possible input and a resulting output of a self-oscillating PWM modulator, where FIG. 3a illustrates an exemplary input sinusoidal signal of x(t)=20 kHz-6 dB and FIG. 4b illustrates the resulting output pwm(t) of the modulator.

It is noted that the oscillation in the self-oscillating embodiment illustrated in FIG. 4a is floating in the sense the switch signal is an overlay signal, which when combined with a threshold-triggered circuit, e.g. a comparator, will result in a desired modulation of the input signal, here a PWM-modulated signal.

Figure 5:
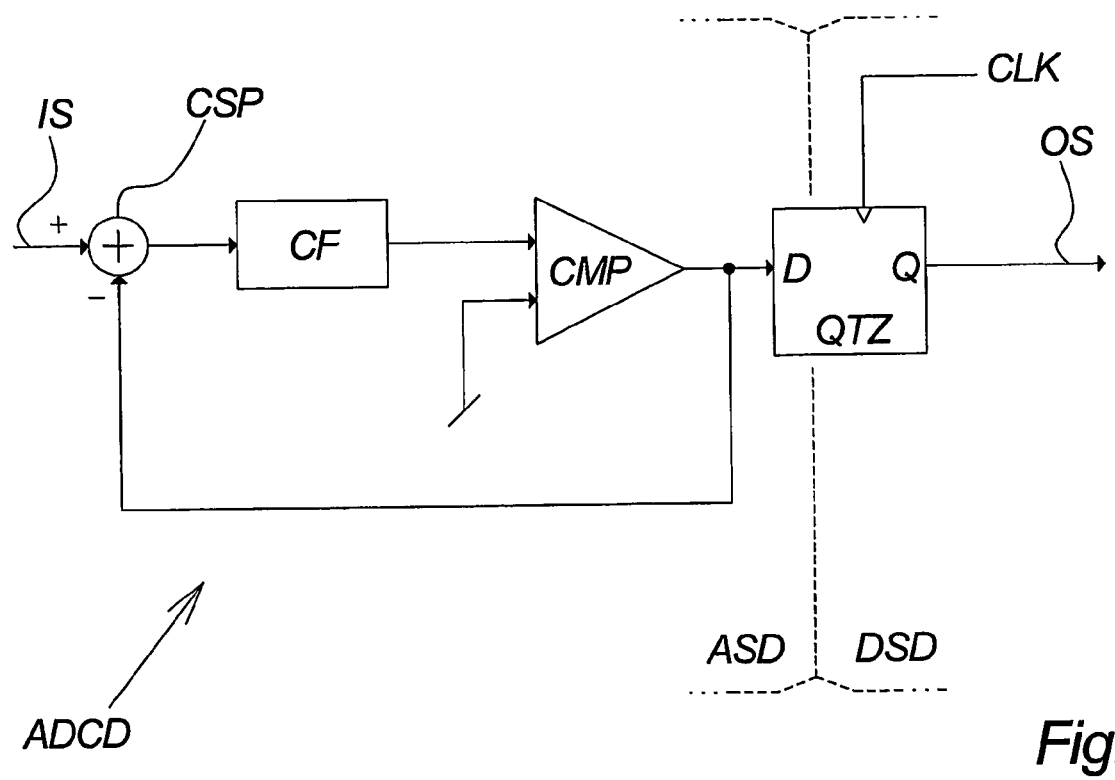
FIG. 5 illustrates self-oscillating modulator according to an embodiment of the invention.

FIG. 5 illustrates a self-oscillating A/D modulator, an A/D converter ADCD according to an embodiment of the invention.

The embodiment comprises an input by means of which an analogue input signal IS is fed to a comparator CMP via a filter CF and a subtraction point CSP. The output of the comparator CMP is fed to the input D of latch QTZ, which again delivers an output signal OS by means of an output Q. The output of the comparator QTZ is fed back to the subtraction point CSP and subtracted from the input signal IS from the input of the modulator.

Basically, the illustrated modulator, also referred to as A/D-converter, comprises two stages, a first self-oscillating stage comprising an analogue modulator, e.g. a self-oscillating PWM modulator and a second stage comprising an A/D sampler adapted for conversion of the signal received from the first stage into a stream of digital pulses. The task of the first stage is primarily to establish a modulated representation of an input signal IS. The modulated representation may according to the illustrated embodiment comprise a PWM signal. Several variations of techniques based on self-oscillation are suitable for establishing a modulated representation of an analogue input signal IS.

The established modulated signal, here: on the output of a comparator CMP may be regarded as an analogue modulated version of the input signal.

Another way of looking at the first stage is that an input signal is quantized on the basis of the amplitude of the input signal IS, here quantized in two amplitude levels, i.e. as a conventional PWM signal.

In the second stage the analogue signal may be converted to a digitally represented signal suitable for further digital signal processing. In the illustrated embodiment a conventional fast running latch QTZ is applied as a time quantizer and outputs a digital PWM signal.

Basically, the output signal OS of the second stage may be regarded as a PCM signal.

An advantage of the illustrated converter is basically that the first stage established a modulated version of the input signal by very simple and high-accuracy modulation by means of a self-oscillating modulator, and then, subsequently in a separate stage, transforms the obtained signal into a digitally represented signal and at the end establishing a signal quantized in two dimensions, time—and amplitude.

The distinction between the signals flowing in the two stages is illustrated by the dotted line, where the domain left to the line may be regarded as an analogue domain ASD and the domain right to the line may be regarded as a digital domain DSD.

Generally, within the scope of the invention, a time quantizer may comprise e.g. a latch, variants of a latch,— e.g. a cascaded double latch, relatively simple A/D converters, etc.

Figure 6A:
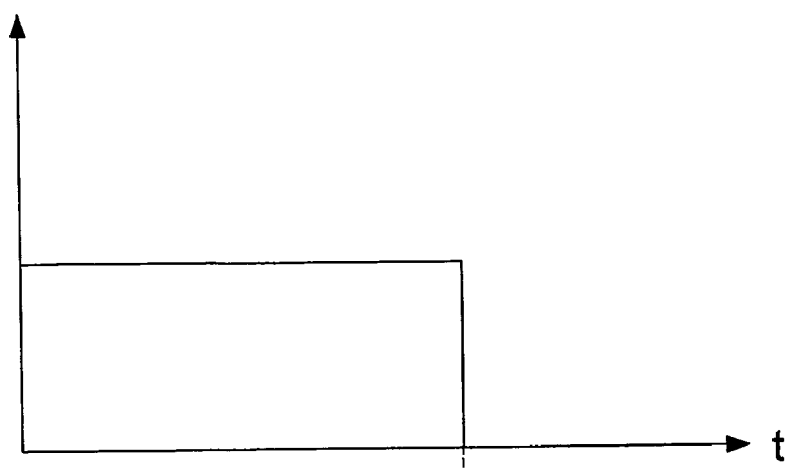
FIG. 6a and 6b illustrate the A/D conversion according to the embodiment of FIG. 5.
Figure 6B:
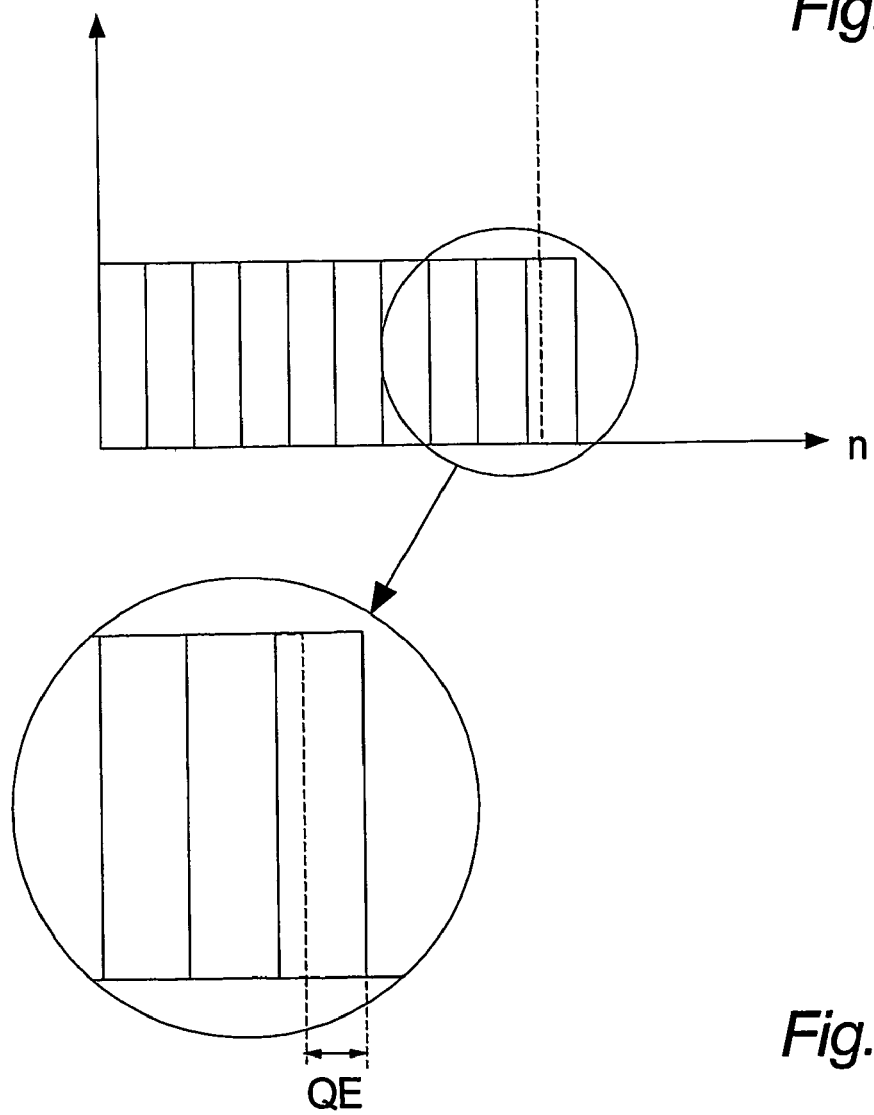

FIG. 6a and 6b illustrate the principles of A/D-conversion of a PWM signal, or a derivative of a PWM-signal, into a PCM signal. In FIG. 6a, an analogue PWM signal is provided, e.g. as present on the output of the comparator CMP of FIG. 5. The signal is then quantized with respect to the time axis T and a time quantized signal is obtained in FIG. 6b.

The resolution in time may differ from application to application, e.g. approximately be one hundred quantizing steps per period.

The quantized signal may be indexed immediately or preprocessed prior to indexing. One of several preprocessing techniques may e.g. imply different kinds of filtering, e.g. down sampling, in order to reduce the sample rate.

It is noted that the quantized signal in FIG. 6b is limited in resolution and inherits a quantizing error, QE, due to the in nature limited number of time-quantizing steps. This quantizing error may of course be minimized by increasing the number of time-quantizing steps per period. Alternatively, advanced noise-reduction algorithms may be applied.

The obtained signal illustrated with reference to the n-axis is according to the invention regarded as a combined amplitude and time-quantized signal in the sense that the y-axis represents two possible amplitude quantization levels, e.g. 1 and 0, and the time axis n represents a time-quantized digital representation. Thus, according to the invention, the obtained signal comprises a PWM-signal or derivative thereof quantized in two-dimensions, amplitude and time.

A further embodiment of the invention, which will be described in the following, comprises a multi-level PWM, where the quantization resolution has been increased compared to the illustrated two-level quantization.

Figure 8A:
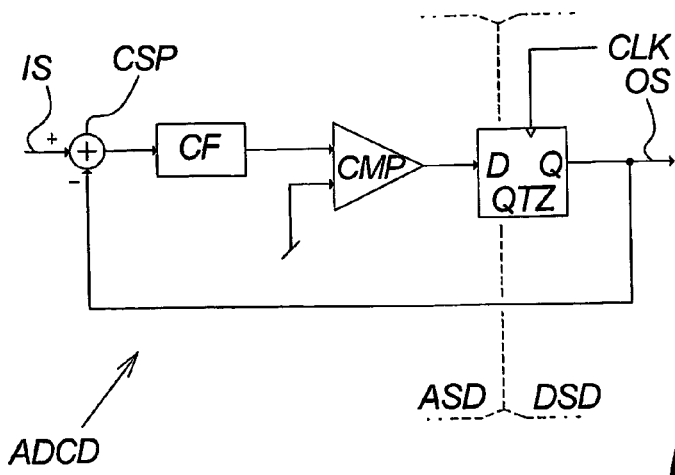
FIG. 8a-8c illustrates a further embodiment of the invention where the time quantizer is included in the self-oscillating loop.

According to a preferred embodiment of the invention, e.g. as illustrated in FIG. 8a, time-quantization error QE has been reduced by including the time quantization in the self-oscillating loop.

Figure 7:
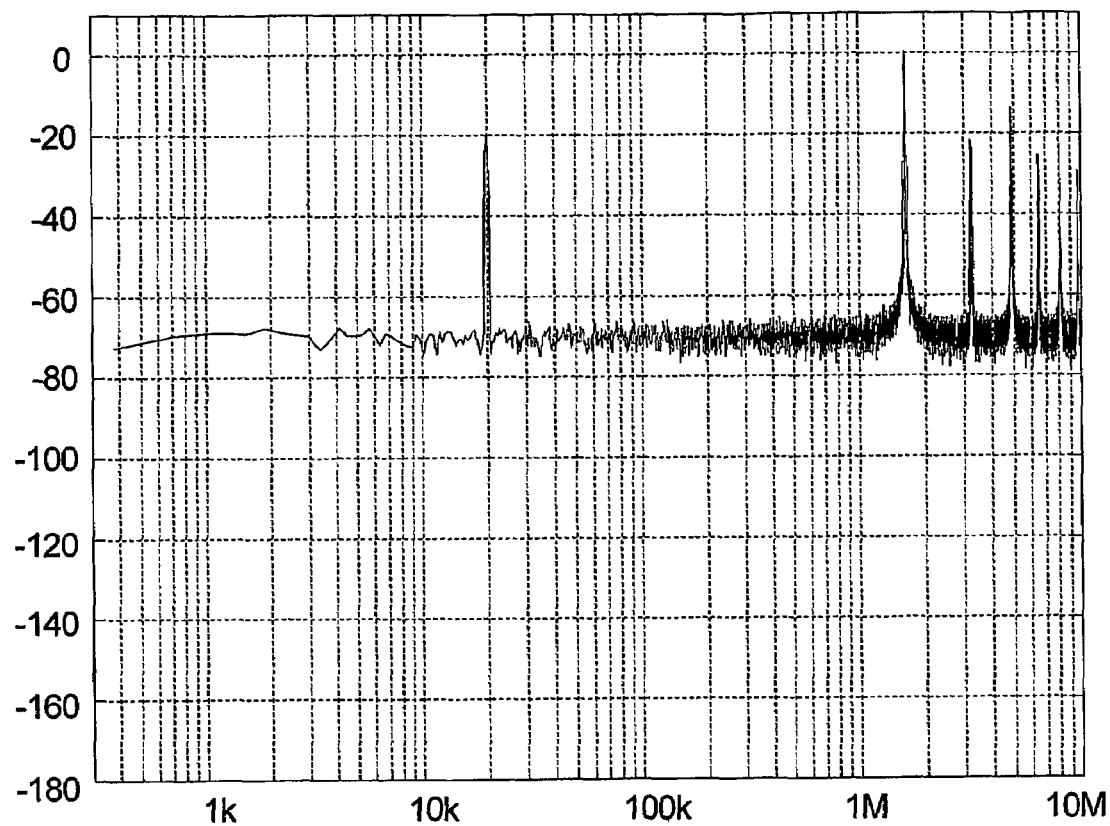
FIG. 7 illustrates the noise spectrum of a pulse width modulator according to the embodiment of FIG. 5 when applying a sinusoidal input.

FIG. 7 illustrates the noise spectrum of a PWM modulator according to the embodiment of FIG. 5 when applying a sinusoidal input as described with reference to FIG. 4a and 4b.

It is noted that the main noise spectrum is substantially white and that the noise primarily results from quantizing noise of the time quantizer, e.g. a latch, i.e. a one-bit sampler. It is further noted that the peaks occur at, obviously, −20 dB, 20 kHz, representing the input signal and further peaks occur at approximately $n \cdot f_{switch}$, where $f_{switch}$ refers to the switch frequency, here approximately 1.6 MHz+ and n refer to a number 1, 2, 3, etc.

It is also noted that there is a noise floor at approximately −70 dB, which for several applications may be completely acceptable.

FIG. 8a illustrates a preferred embodiment of the invention where a time quantizer has been included in the self-oscillating loop.

In principle, the illustrated embodiment features both the amplitude quantizing and time quantizing means, but now coupled and interacting in a very sophisticated way. The embodiment comprises an input by means of which an analogue input signal IS is fed to a comparator CMP via a subtraction point CSP and a filter CF. The output of the comparator CMP is fed to the input D of latch QTZ, which again delivers an output signal OS by means of an output Q. This signal path is an example of the at least one forward path according to the terms applied for the purpose of describing the invention. The output of the latch QTZ is moreover fed back to the input of the subtraction point CSP and subtracted from the input signal IS on the input of the modulator. This signal path enabling this feedback is an example of the at least one feedback path referred to in the claims.

It is initially noted that the illustrative distinction between the analogue and the digital domain illustrated by the dotted line is somewhat more difficult to establish. A further explanation of the distinction between the digital and analogue domain is given in example FIG. 8b.

The basic difference between the above-illustrated embodiment in FIG. 5 and the present embodiment of the invention is that time quantizer in the form of the latch QTZ is now included in the self-oscillating loop. The inclusion of the time-quantizer in the self-oscillating part of the loop has some very important and significant advantages due to the fact that noise induced by the latch QTZ is suppressed by the feedback loop. This feature will be described in details below. The suppression of noise includes among other error components most significantly time-quantizing noise.

Although differing from the embodiment of FIG. 5, the available time resolution steps are still limited in number, e.g. about one hundred per period as explained in the above embodiment. However, now the time quantizer has been included in the feedback loop of the self-oscillator, thereby, averaging the time-quantized signal more truly to the inputted analogue signal. Evidently, such an improvement may suitably be exploited by the use of subsequent filtering, converting the time-quantized signals e.g. into a corresponding high-resolution amplitude encoded signal e.g. by low-pass filtering.

It is noted that an interesting feature of the illustrated embodiment of the invention is that no clear distinction between the analogue and digital domain may be made although the distinction is very clear. The feature results in a very simple establishment of a hybrid analogue/digital self-oscillating modulator, where the established digital output signal, i.e. here the output of the illustrated latch is branched both as an analogue signal directly fed back to the input of the modulator and from there forming part of a comparison between to basically analogue signals and as a digital output signal OS intended for further processing. The applied D/A-conversion is in principle performed by the hold-circuit of the latch.

Figure 8B:
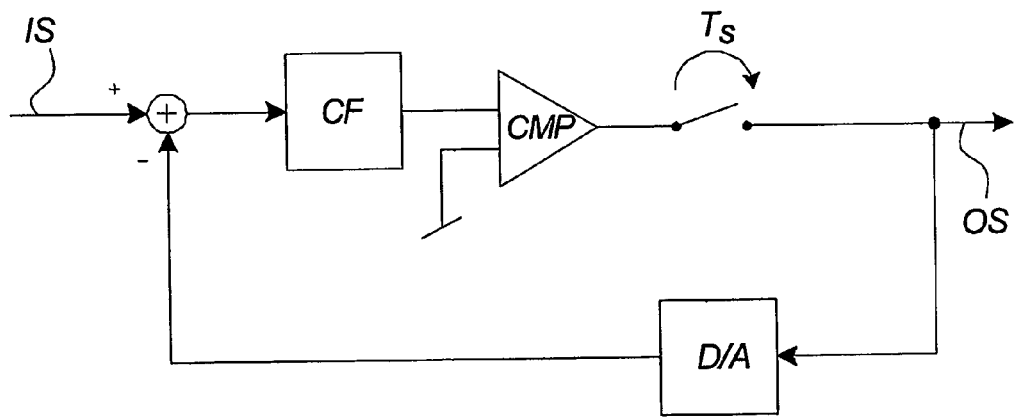

This feature is illustrated a little more detailed with reference to FIG. 8b illustrating in principle the same embodiment as FIG. 8a, but now pin-pointing the advantageous branching of both digital and an "analogue" signal on the output of a latch circuit.

Thus, FIG. 8b illustrates the branching of a digital output from the latch QTZ derived from the sampler as the digital output OS and the establishment of an analogue signal in the feedback path by means of a D/A converter, i.e. in the current embodiment the hold circuit of the latch.

Figure 8C:
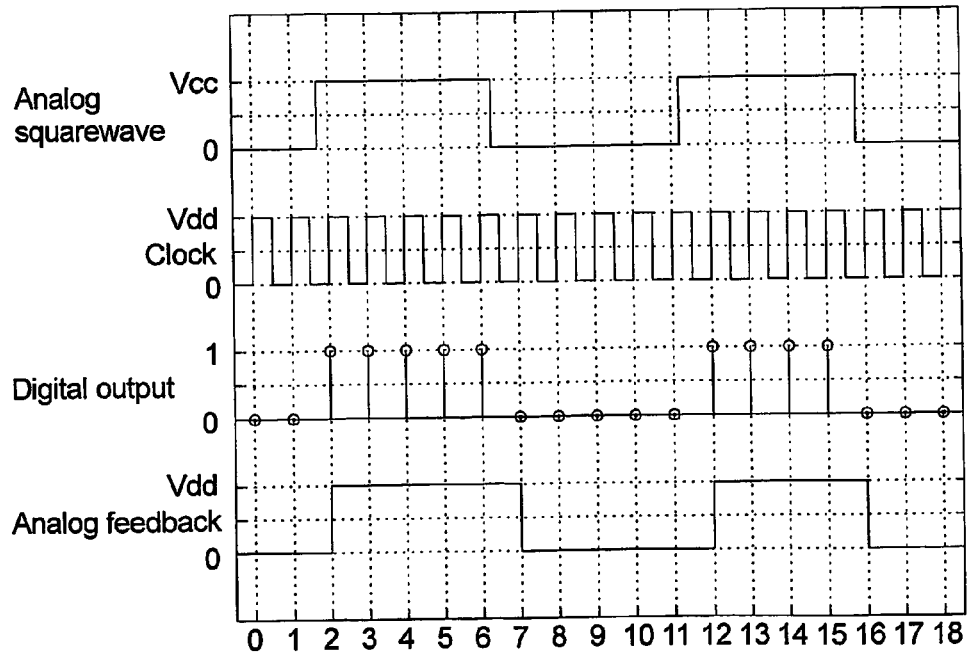

The functioning of the applied sample/hold latch is showed in FIG. 8c, illustrating the streaming and the character of the involved signals on the input and the output of the illustrated latch.

Figure 9:
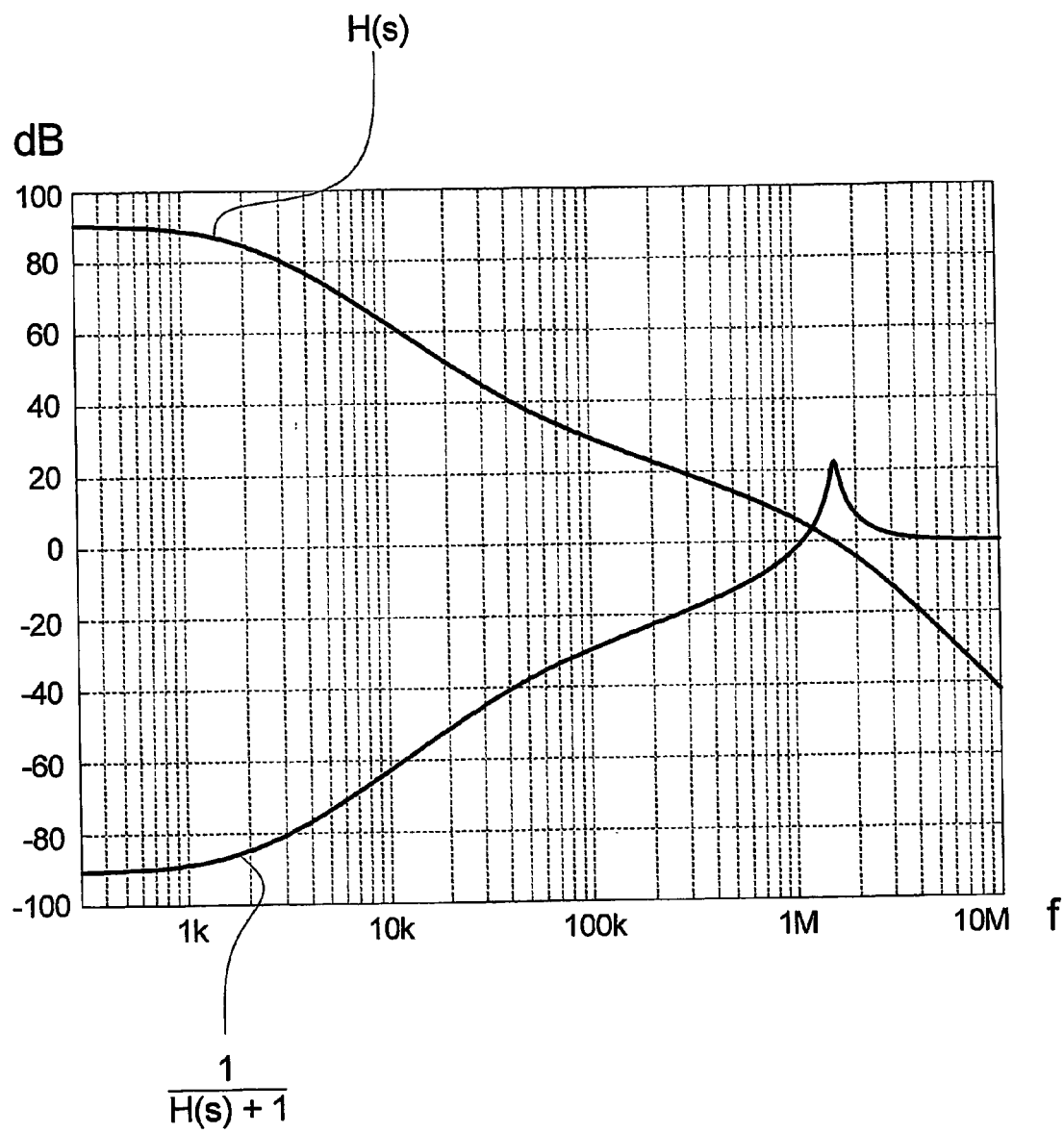
FIG. 9 illustrates two principle transfer functions illustrating the performance of the preferred embodiment of FIG. 8.

FIG. 9 illustrates two principle transfer functions illustrating the performance of the preferred embodiment of FIG. 8a.

The transfer function H(s) basically refers to a filter of an embodiment of the invention, e.g. defined primarily as indicated in most of the illustrated embodiments in the forward path, just in front of the comparator. Evidently, the resulting open-loop transfer function may be the result of further filtering means, e.g. included in the feedback path. The illustrated transfer function H(s) is designed to have a 0 dB gain at approximately −180 degrees. As mentioned earlier the switching frequency is determined by the phase of −180 degrees.

Moreover a further, and in this context very interesting transfer function is illustrated, namely the error-transfer function 1/((H(s)+1). This transfer function represents the advantageous properties with respect to noise induced by a time quantizer, which may in fact be obtained when including the time quantizing in the self-oscillating loop. It is noted that a significant suppression of errors originating from the time-quantizing circuit or circuits may be obtained in combination with an attractive broad-banded transfer function H(s).

Figure 10:
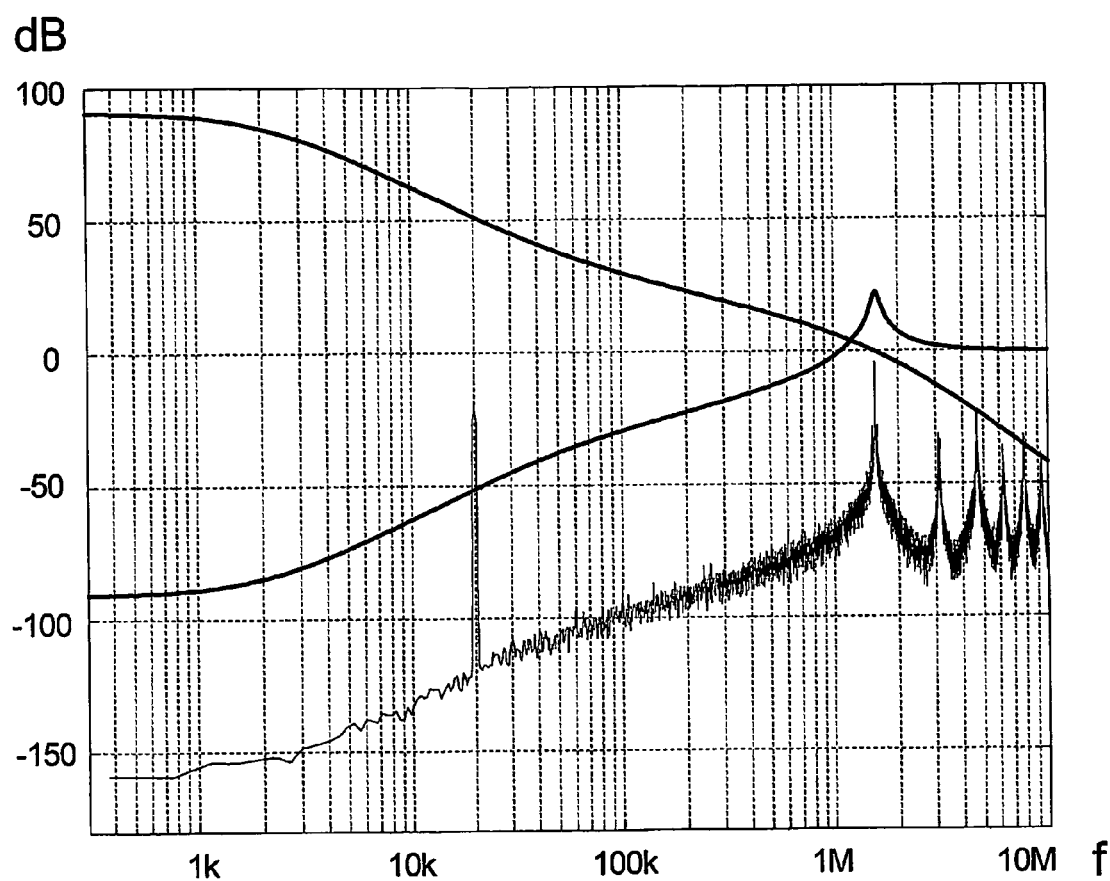
FIG. 10 illustrates the noise spectrum of the embodiment of FIG. 8.

FIG. 10 illustrates an example of a noise spectrum related to the embodiment illustrated in FIG. 8. The noise spectrum is the resulting spectrum of an example of the embodiment of FIG. 8a and 8b when an input signal of −20 dB, 20 kHz has been inputted to the converter.

It is noted that the main noise spectrum is not white any longer, when compared to the above-mentioned embodiment of FIG. 5, although peaks occur at, obviously, −20 dB, 20 kHz, representing the input signal and further peaks occur above the switching frequency at $n \cdot f_{switch}$, where $f_{switch}$ refers to the switch frequency, here approximately 1.6 MHz+ and n refers to a number 1, 2, 3, etc.

In this embodiment, it is, however, noted that a significant improvement has been obtained compared to the noise floor resembling white noise as illustrated in FIG. 7 and the noise floor is kept below −80 dB even up to 200 kHz and higher.

Figure 11:
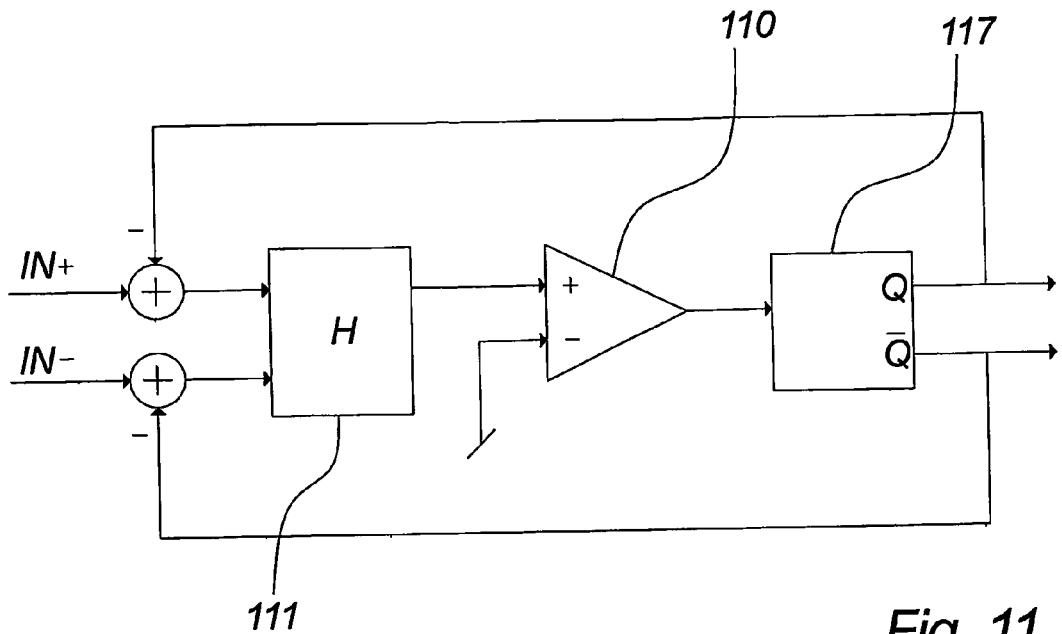
FIG. 11 illustrates a preferred differential embodiment of a self-oscillating modulator according to an embodiment of the invention.

The quantizing noise has thus been suppressed to a relatively large degree in the illustrated embodiment by the inclusion of the time quantizer in the self-oscillating loop and the suppression corresponds to the noise transfer function illustrated in both FIG. 9 and FIG. 10. Again, it should be noted that the illustrated noise-transfer function relates to the noise originating from the time quantizer, e.g. a latch as illustrated in FIG. 8a FIG. 11 illustrates a differential embodiment of the invention of an analogue to PCM converter according to an embodiment of the invention. In this embodiment, two differential input signals IN+ and IN− are fed to a comparator 117 via filtering means 111 and the output of the comparator is then fed to a fast-running latch 110. The output of the latch Q and complement Q. Basically, this illustrated embodiment corresponds to the embodiment of FIG. 8, now only in a differential topology.

This differential embodiment of the invention is suitable in many applications, especially high-end converters.

Figure 12:
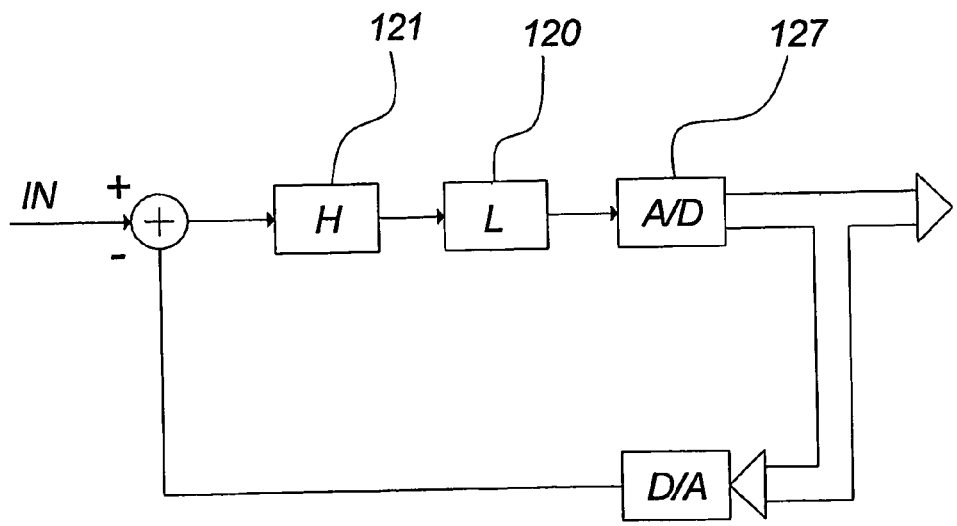
FIG. 12 illustrates a multi-bit version of a self-oscillating modulator according to an embodiment of the invention.

FIG. 12 illustrates a multi-bit version of a self-oscillating modulator according to an embodiment of the invention. Evidently, it should initially be noted that the differential version including the illustrated principle topology may be applied within the scope of the invention.

The illustrated multi-bit self-oscillating converter features an input IN connected to a multi-bit A/D converter 127 via filtering means 121 and a limiter 120. The multi-bit converter outputs a multi-bit modulated version of the input signal fed to the input of the converter on the input IN. Basically, the output version may be regarded a combined both time and amplitude quantized signal. This signal may by means of not-shown post-processing means be converted into a suitable data format if so desired.

Moreover, the output of the converter 127 is fed back to the input via a D/A converter 128 converting the output signal into a signal compatible with the input signal on IN, thereby availing the desired self-oscillating properties.

The illustrated output may e.g. comprise a multi-level signal, typically relatively few different levels in order to minimize the possible non-liniarities in the obtained signal.

In this embodiment compatibility between the digital output of the modulator and the analogue input of the modulator is obtained by applying a multi-bit D/A converter in the feedback-path and thereby ensuring that the output of the modulator may be applied as feedback signal to the input. Evidently, in this embodiment a relatively fast multi-bit D/A converter should be applied for the purpose of minimizing the delay in the feedback path.

One of several alternatives of the above embodiment within the scope of the invention is to include the limiter in the A/D converter's effective transfer function.

Figure 13:
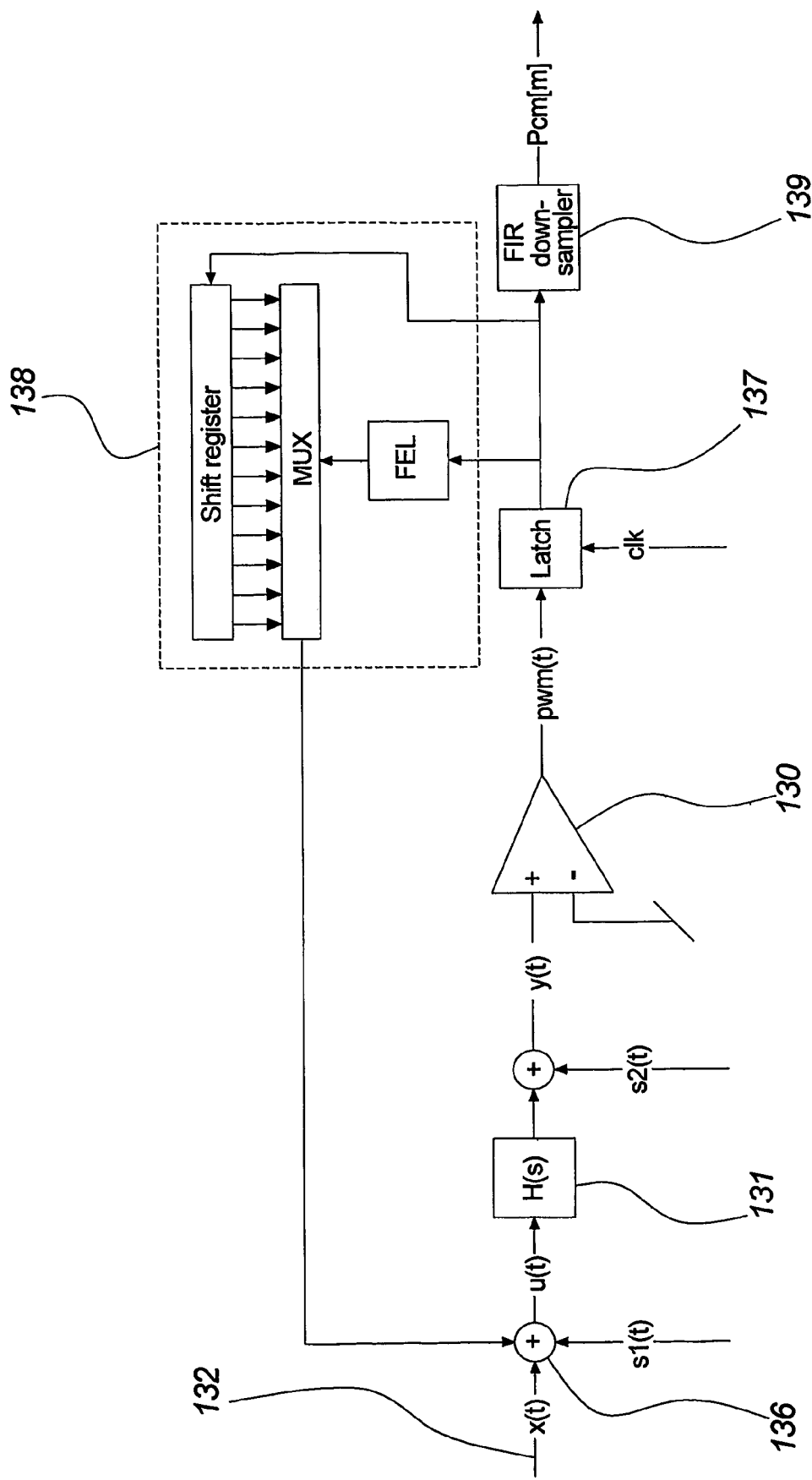
FIG. 13 illustrates an analogue to PCM converter according to an embodiment of the invention.

FIG. 13 illustrates an example of an A/D converter according to an embodiment of the invention. The illustrated converter comprises an input 132, which via a subtracting point 136 and filtering means 131 is fed to a comparator 130. The output of the comparator 130 is fed to a latch 137, which again outputs a time-quantized signal to a down sampling circuit 139 outputting a PCM down sampled signal. The output of the latch is furthermore fed back and added to the input 132.

The feedback path comprises frequency control means 138 for fixation of switch frequency or at least for obtaining a steady switch frequency. When the switch frequency is allowed to fluctuate it may cause interference problems when, e.g. several self-oscillating A/D-converters are implemented on a single printed circuit board, or close to each other. Furthermore a stable switch frequency facilitates synchronization of several converters. It comprises a frequency estimator FEL, a multiplexer MUX and a shift register. The shift register receives the output values from the latch, e.g. as in a first-in-first-out FIFO register, and thus retains information about an appropriate number of these values. The specific number of values that should be remembered depends on the particular embodiment, and may correspond to, e.g., the number of values established by the latch within a fraction of a switch period, in principle within ½ of a period of the desired switch frequency and more practically usable within, e.g., 1/10 of a period of the desired switch frequency. For each latch output value, the oldest value in the shift register is discarded. The frequency estimator FEL monitors the switch frequency by monitoring the output of the latch, and controls, by means of the multiplexer MUX, which of the retained output values that should be fed back to the input 132. The frequency control means 138 is thereby able to vary the loop delay, i.e. the time by which the output values are delayed before fed back to the input 132, which again results in a variation of the switch frequency. The self-oscillation switch frequency in this embodiment is thus basically determined by the filtering means 131 in combination with the frequency control means 138. This design is basically applied for the purpose of counteracting the influence of variations of the input amplitude on the switch frequency.

It is noted that the specific embodiment of a frequency control means shown in FIG. 13 may be substituted by any possible means for controlling the loop delay, or variants of the embodiment of FIG. 13. Furthermore the frequency control means, i.e. a variable loop delay, may be positioned in the signal forward path instead of, or in addition to, in the feedback path.

FIG. 13 further comprises additional inputs s1(t) and s2(t). These may also be used for controlling or influencing the switch frequency. By applying to one of these inputs a periodic signal, preferably a square wave but any waveform type or composite type may be used, having a frequency equal to the desired switch frequency, this periodic signal is added to the input signal x(t) or filtered input signal y(t). This again causes the switch frequency of the self-oscillating loop to substantially stick to the frequency of the additional input signal s1(t) or s2(t). The additional signal may have an amplitude of, e.g., 5% of the maximum input signal amplitude. Preferably only one additional input should be used, but FIG. 13 shows different preferred positions to apply this input. It should be noted that applying the additional periodic signal anywhere else in the circuit is within the scope of the present invention, however not preferred.

When both the variable loop delay, e.g. controlled by the frequency control means 138, and the additional periodic signal s1(t) or s2(t) are applied in one embodiment, the primary purpose of the variable loop delay is to maintain the switch frequency within a tolerance, i.e. roughly locking the frequency, whereas the primary purpose of the additional periodic signal is to restrict this tolerance further, i.e. preferably completely lock the switch frequency.

Figure 35A:
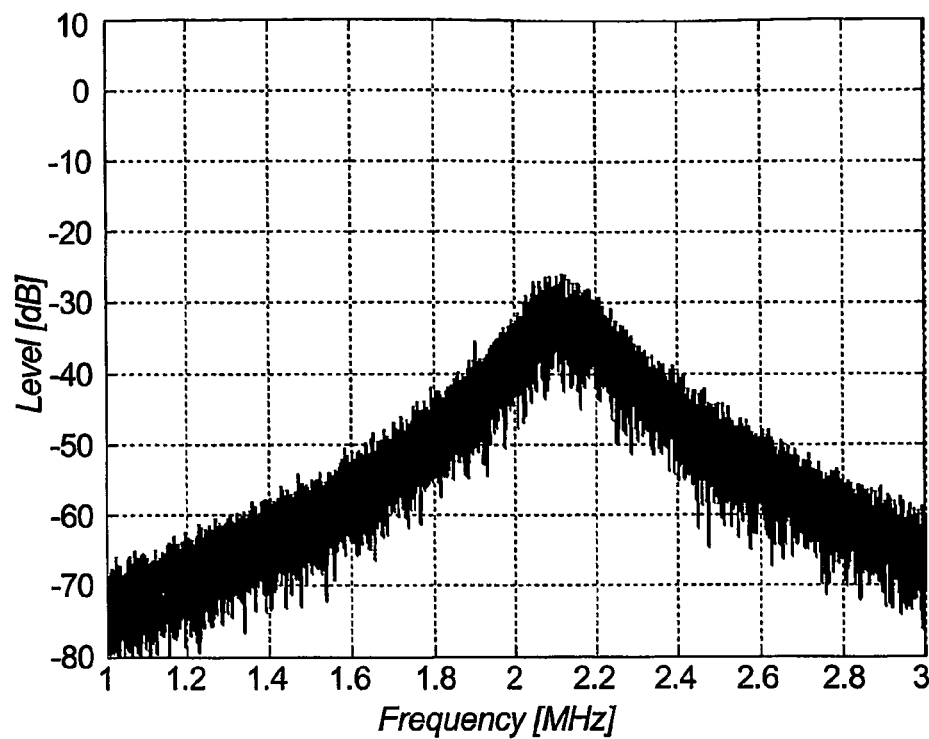
FIG. 35A and 35B illustrates results of locking the switch frequency.
Figure 35B:
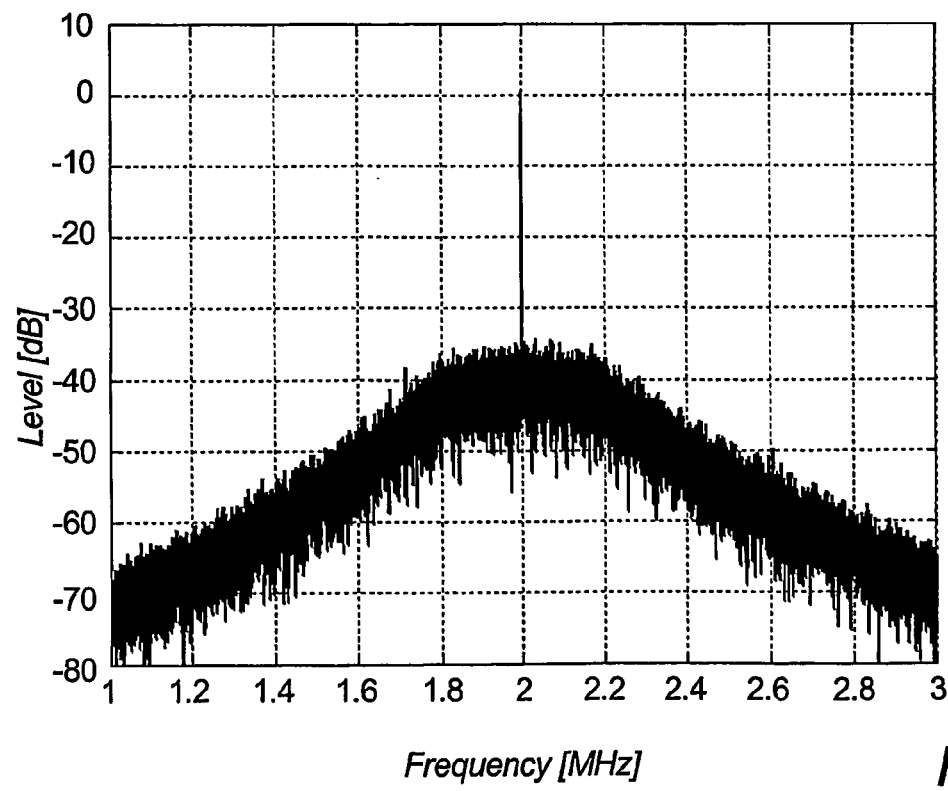

The result of applying an additional periodic signal as described above can be seen from FIGS. 35A and 35B. Both figures are spectrums obtainable from a particular embodiment of the present invention, where the desired switch frequency is chosen to be 2 MHz. FIG. 35A illustrates the spectrum when no additional signal is applied, and shows the spectrum for frequencies within the range of 1 MHz to 3 Mhz. The spectrum is expected to peak at about 2 MHz, but as seen from FIG. 35A the specific peak frequency is rather unclear, and it is actually rather at 2.1 MHz. FIG. 35B illustrates the spectrum of the same particular embodiment as for FIG. 35A, but this time an additional periodic signal with an amplitude of 5% of the input signal maximum amplitude is applied. As can be seen from FIG. 35B the spectrum of this embodiment clearly comprises a significant peak at rather precisely 2 MHz.

The down sampling circuit 139 may also be referred to as a decimator. This decimator comprises an anti aliasing filter having an impulse response which is longer than the period of the pulse width modulated signal, preferably at least longer than three times the period of the pulse width modulated signal.

Figures 14, 15:
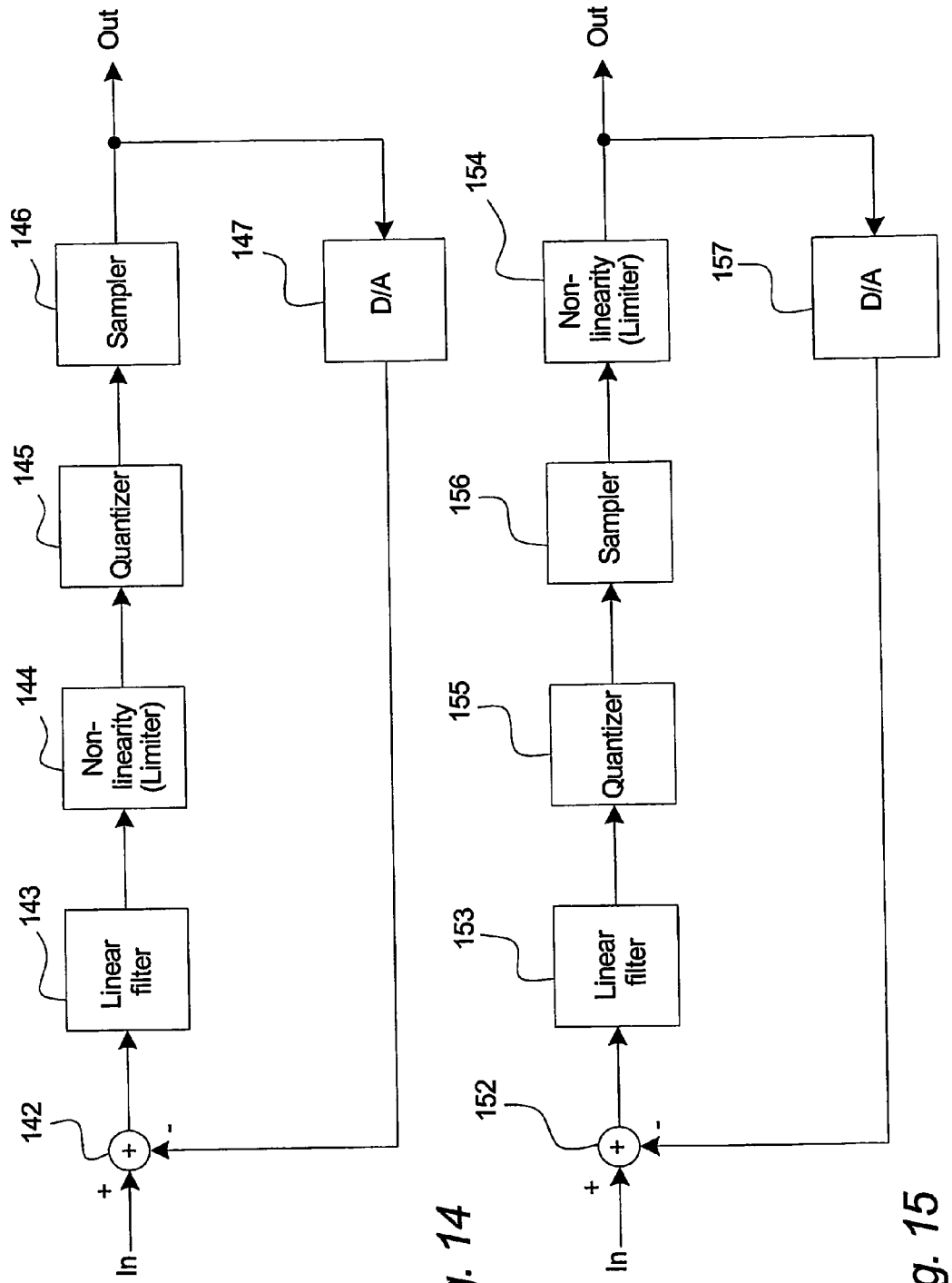
FIG. 14 illustrates the principles of a self-oscillating modulator where the time quantizer is included in the self-oscillating loop.
FIG. 15 illustrates an embodiment of the invention where the non-linearity is arranged in the digital domain.

The stopband attenuation of the underlying antialiasing filter of a decimator applied in connection with the A/D-converter according to the invention must generally be greater than 60 dB, preferably greater than 100 dB. The stopband for this type of antialiasing filter equals:

$$\text{Stopband} = k \cdot fs_{OUT} \pm BW$$

where k =1,2,3, . . . until the Nyquist frequency is reached, $fs_{OUT}$ is the output rate of the decimator and BW is the utility bandwidth, typically 20 kHz FIG. 14 illustrates the principles of a self-oscillating modulator where the time quantizer is included in the self-oscillating loop.

The illustrated embodiment of the invention comprises the following principal functional steps starting with an input feeding a summing point 142, elsewhere referred to a subtraction point. The output of the summing point is fed to a non-linearity, —a limiter 144 via a linear filter 143. The limiter outputs the limited, i.e. modulated, signal to a quantizer 145. The quantizer 145 quantizes the modulated signal in the amplitude domain and feeds a sampler 146 adapted for time quantizing of the signals received from quantizer 145. The time-discrete output of the sampler 146 is fed to the output of the arrangement and moreover fed back to the summing point 142 via a D/A converter 147. The D/A converter is adapted for converting the time-discrete signal into an analogue representation compatible with the input signal.

It is noted that the above-described embodiment in principle may be applied in a single or multi-bit application. In a single bit implementation, the limiter 144 and the quantizer 145 would typically comprise one single comparator providing both the desired non-linearity and the desired, i.e. two levels, quantizing level. In such an embodiment, the D/A converter in the feedback path of the oscillator may be omitted as the desired analogue signal for the feedback path is in principle provided by the hold-circuit of the latch and may be branched back to the summing point as an analogue signal, whereas a digital signal is output for further processing. An example of such topology is illustrated in FIG. 8.

FIG. 15 illustrates an embodiment of the invention where the non-linearity is arranged in the digital domain.

The illustrated embodiment of the invention comprises the following principal functional steps starting with an input IN feeding a summing point 152. The output of the summing point is led to a quantizer 155 via a linear filter 153. The quantizer 155 quantizes the filtered signal and feeds a sampler 156 adapted for time quantizing of the signals received from quantizer 155. The time-quantized signal is then fed to a non-linearity 154, i.e. a limiter. The limiter outputs the limited, i.e. modulated, signal to the output of the circuit and moreover feeds a signal back to the summing point 152 via a D/A converter 157. The D/A converter is adapted for converting the time-discrete signal into an analogue representation compatible with the input signal.

Basically, this topology involves the same process steps as the above described, now with the difference that the limiter 154 is included in the digital domain. In other words, the non-linearity is now defining the desired modulation subsequent to the time quantizing of the signal.

FIG. 16 illustrates an embodiment of the invention where the non-linearity is included in an amplitude quantizing self-oscillating loop and cascaded with a subsequent time quantizer comprising a noise shaper.

The illustrated embodiment of the invention comprises the following principal functional steps starting with an input IN feeding a summing point 162A. The output of the summing point 162A is led to a limiter 164 via a linear filter 163A The analogue output, a PWM signal, of the limier 164 is moreover fed directly back to the summing point 162A. This first stage of the circuit forms a self-oscillating modulator.

Moreover, the output of the limiter is fed a quantizer/sampler 165 via a summing point 162B and a linear filter 163B. The time-discrete output of the quantizer/sampler 165 is fed to the output Out of the circuit and is moreover fed back to the summing point 162B via a D/A converter 167. The D/A converter 167 is adapted for converting the time-discrete signal into an analogue representation compatible with the signal received on the input of the summing point 162B from the limiter 164.

Basically, this embodiment differs from the above-described embodiments of FIG. 14 and 15 in the sense that the initial amplitude quantizing and the subsequent time quantizing have now been separated. Hence, the amplitude quantizing is included in the self-oscillating loop 162A, 163A and 164 while the subsequent time quantizing is handled with respect to time-quantizing error in a more conventional way by means of noise shaping.

The benefit of this embodiment is basically, that the filter 163B may be optimized for noise-shaping purposes.

FIG. 17 illustrates an embodiment of the invention corresponding to FIG. 16 but where only the quantizing error resulting from the time quantizer is filtered in the time-quantizing stage.

The illustrated embodiment of the invention comprises the following principal functional steps starting with an input IN feeding a summing point 172A. The output of the summing point 172A is led to a limiter 174 via a linear filter 173A. The analogue output, a PWM signal, of the limiter 174 is moreover fed directly back to the summing point 172A. This first stage of the circuit forms a self-oscillating modulator.

Moreover, the output of the limiter is fed a quantizer/sampler 175 via a second summing point 172B. The time-discrete output of the quantizer/sampler 175 is fed to the output Out of the circuit and is moreover fed back to a third summing point 172C via a D/A converter 177. The D/A converter 177 is adapted for converting the time-discrete signal into an analogue representation compatible with the signal received on the input of the summing point 172C from the limiter 174. Moreover, a linear filter 173B is inserted between the output of the summing point 172C and a further input of the summing point 172B.

It is noted that the noise shaper in the second modulator stage, i.e. the time-quantizing stage, is slightly different from that of FIG. 16, thereby offering another variation of a time noise-shaping characteristic. This variation may, as noted above, be established independent of stage 1, i.e. the amplitude quantizer.

Moreover, it should be noted that stage one of both the above-described embodiments establishes the desired self-oscillation modulation technique, whereas stage two, which is typically not-self-oscillating deals with the time quantizer noise separately within influencing the operation of stage one in other ways than the simple additive function.

FIG. 18 illustrates a further embodiment of the invention where the time-quantizing error is fed back to the amplitude self-oscillating loop.

The illustrated embodiment of the invention comprises the following principal functional steps starting with an input feeding a summing point 182A. The output of the summing point is fed to a limiter 184 via a linear filter 183A. The limiter outputs the limited, i.e. modulated, signal to a quantizer 185. The quantizer 185 quantizes the modulated signal in the amplitude domain and feeds a sampler 186 adapted for time quantizing of the signals received from quantizer 185. The time-discrete output of the sampler 186 is fed to the output of the arrangement and moreover fed back to a second summing point 182B via a D/A converter 187. The D/A converter is adapted for converting the time-discrete signal into an analogue representation compatible with the input signal of the summing point 182B received from the output of the limiter 184. The output of the summing point 182B is moreover fed back to the summing point 182A via a second linear filter 183A.

A further feedback is established from the output of the limiter 184 to the summing point 182A basically forming a self-oscillating/modulating loop, whereas the other loop, the below loop, forms a quantizing error correcting feedback loop according to conventional feedback principles, i.e. substantially non-oscillating.

Basically, the above loop, i.e. the loop comprising the linear filter 183A, the limiter 184 and the feedback to the summing point 182A typically forms the desired self-oscillating modulator, whereas the quantizer 185 and the sampler 186 in a more simple way form a circuit by means of the "below" feedback "line" 187, 183B connected to the summing points 182B and 182A facilitate a more conventional feedback of the time quantizing noise. It is noted that the time-quantizing noise of the combined quantizer 185 and sampler 186 may in fact be fed back effectively to the summing 182A, thereby availing a certain degree of time-quantizing noise suppression by means of the self-oscillating stage one.

FIG. 19 illustrates a further topology of feeding the time-quantizing error back to the amplitude self-oscillating loop.

The illustrated embodiment of the invention comprises the following principal functional steps starting with an input feeding a summing point 192A. The output of the summing point is fed to a limiter 194 via a linear filter 193A and a second summing point 192B. The limiter outputs the limited, i.e. modulated, signal to a quantizer 195. The quantizer 195 quantizes the modulated signal in the amplitude domain and feeds a sampler 196 adapted for time quantizing of the signals received from quantizer 195. The time-discrete output of the sampler 196 is fed to the output of the arrangement and moreover fed back to a third summing point 192C via a D/A converter 197. The D/A converter is adapted for converting the time-discrete signal into an analogue representation compatible with the input signal of the summing point 192C received from the output of the limiter 194. The output of the third summing point 192C is moreover fed back to the second summing point 192B via a second linear filter 193B.

A further feedback is established from the output of the limiter 194 to the summing point 192A basically forming a self-oscillating/modulating loop, whereas the other loop, the below, forms a quantizing error-correcting feedback loop according to conventional feedback principles, i.e. substantially non-oscillating.

Basically, the above loop benefits from a separate handling of the time-quantizing signal from the sampler 196 and the input due to the different filters 193A and 193B.

FIG. 20-23 illustrate examples of non-linearities, limiters applied in the self-oscillating loop(s) according to embodiment of the invention.

Figure 20:
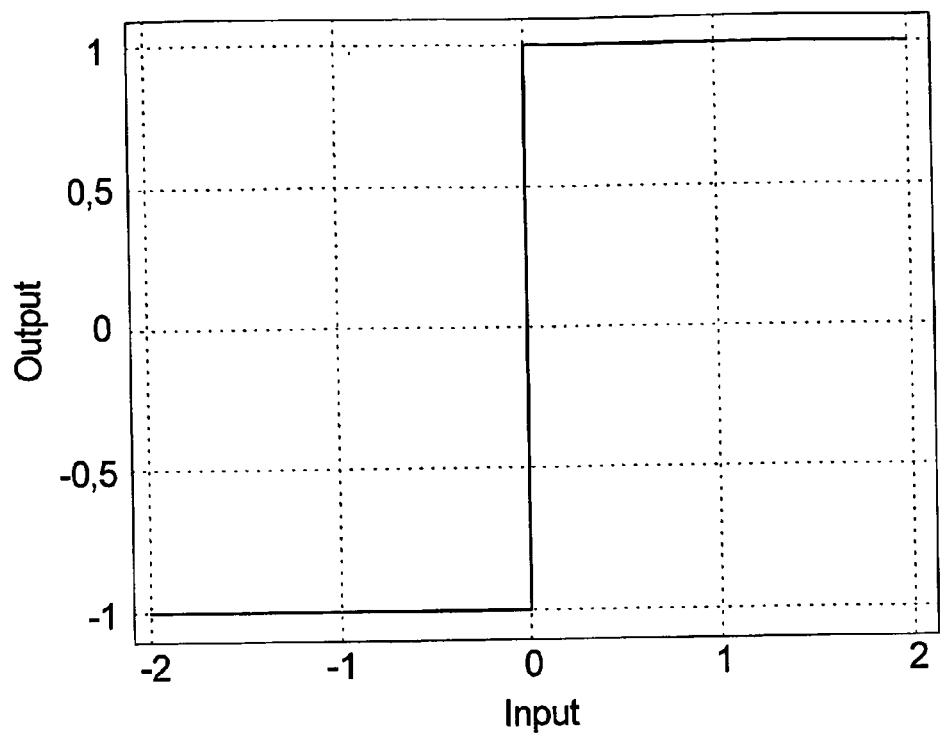
FIG. 20-23 illustrate examples of non-linearities applied in the self-oscillating loop(s) according to an embodiment of the invention.
Figure 21:
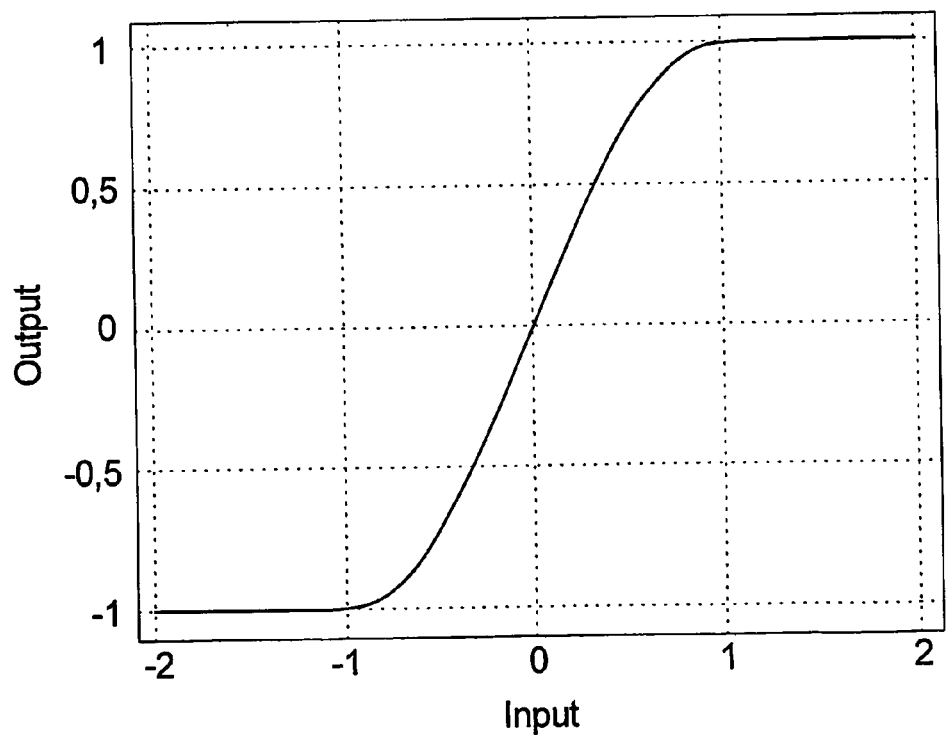
Figure 22:
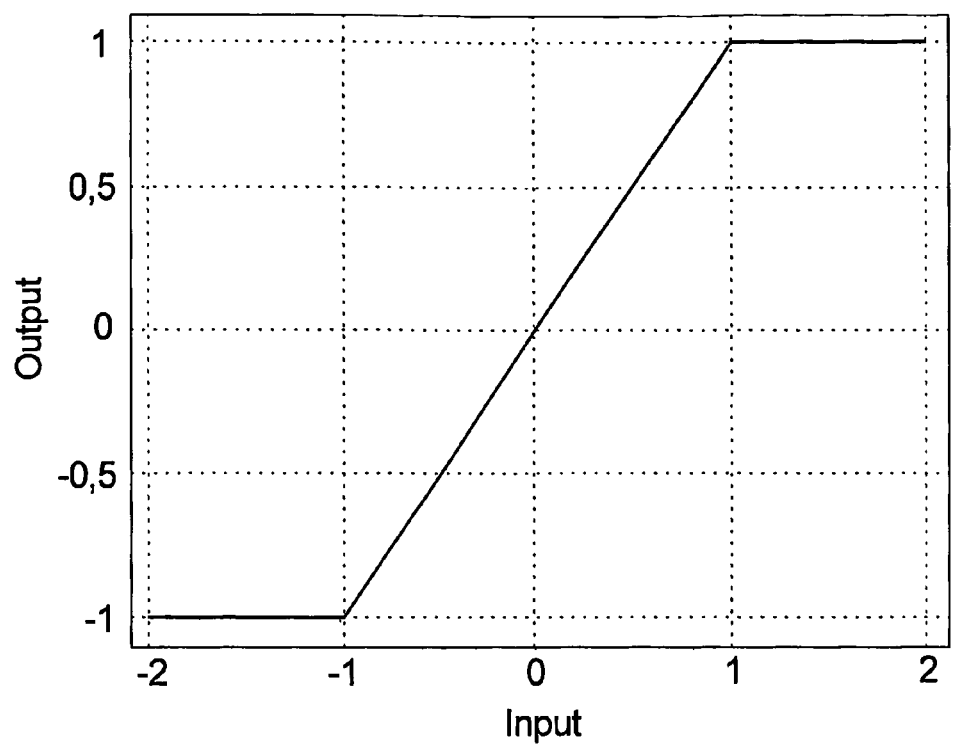
Figure 23:
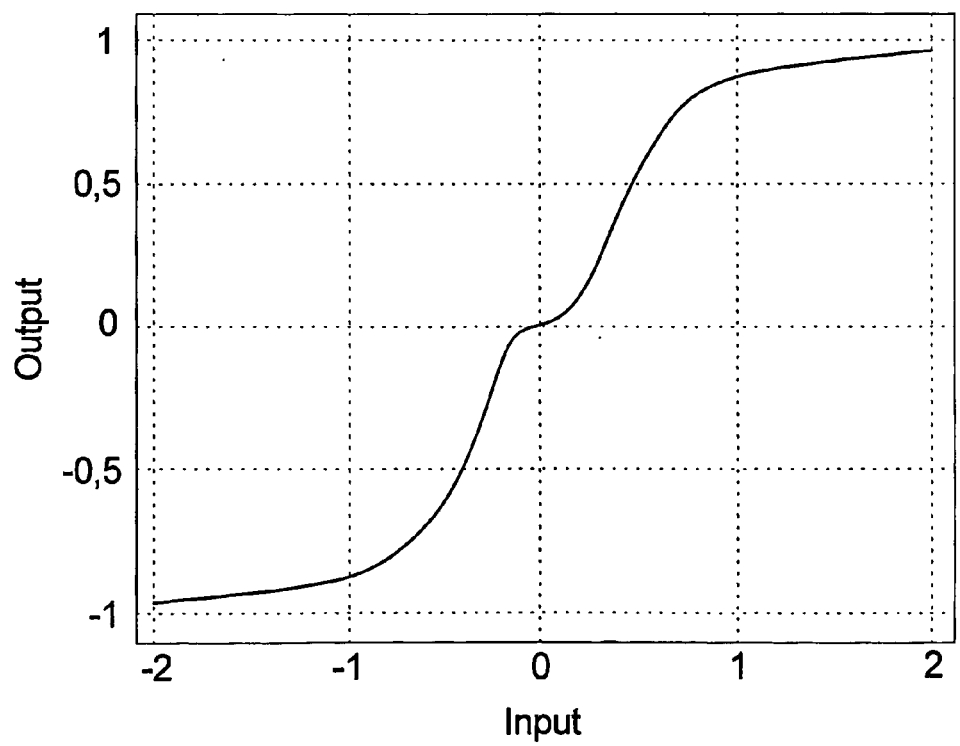

It is noted that the applicable limiter transfer functions may vary significantly within the scope of the invention, from the hard-clipper of FIG. 20, to the more soft-clipping limiters of FIG. 21, 22 and 23. The soft-clipping limiters may advantageously be combined with multi-bit PWM quantizers as the transition between one clip and the opposite may be more detailed described. This feature will be illustrated below.

According to the invention, a non-linearity is required for obtaining the desired combination of oscillation and modulation as obtained by self-oscillating modulators. Note that the soft-clipping arrangement is also regarded as a limiter, although the illustrated two clipping levels are basically only reached at infinite. Evidently, several other limiter characteristics may be applied within the scope of the invention.

Figure 24:
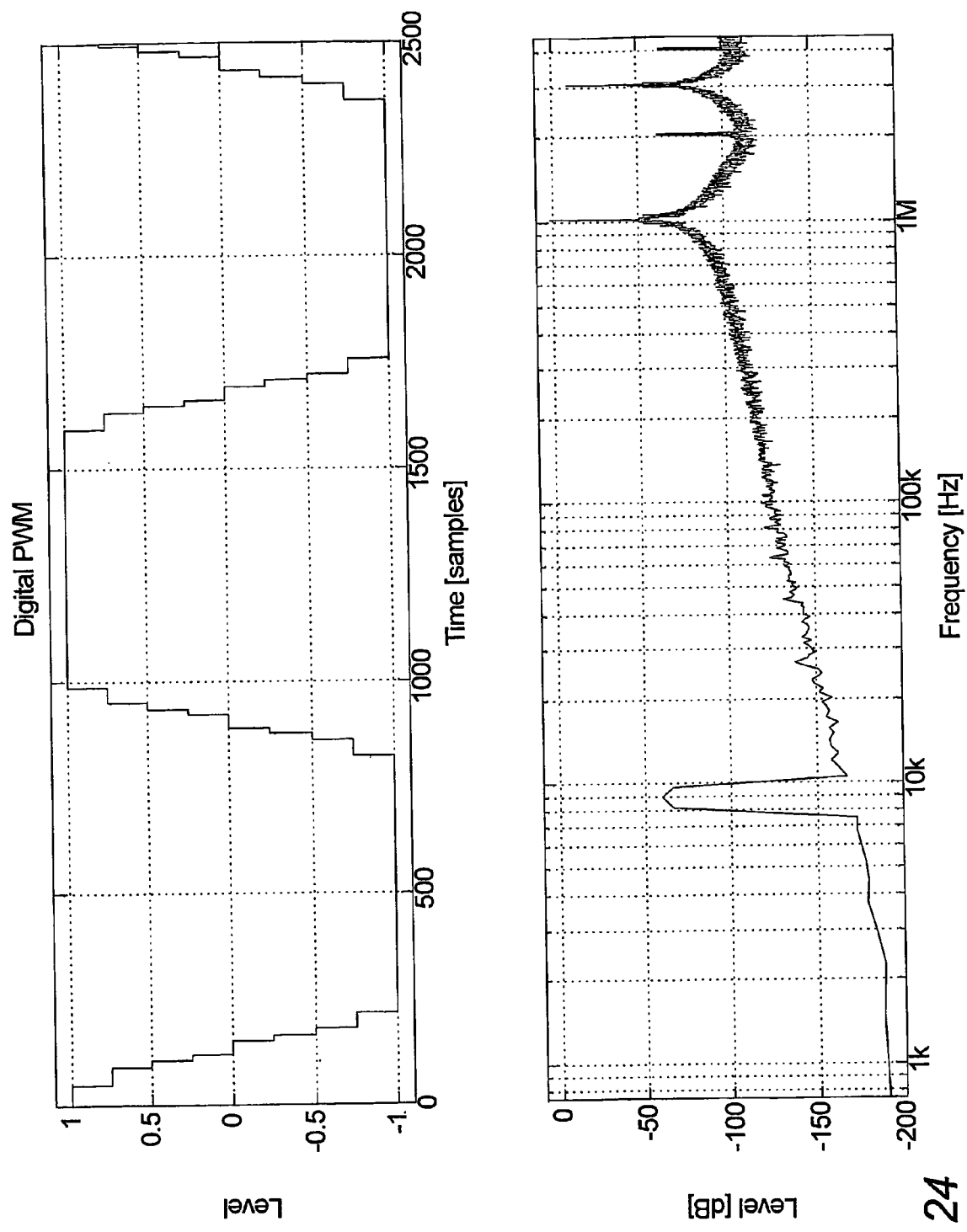
FIG. 24 illustrates the characteristics of a seven-level digital pulse width modulator.

FIG. 24 illustrates the characteristics of a seven-level digital PWM modulator according to an embodiment of the invention. The illustrated embodiment shows an exemplary seven-level PWM modulation signal as a function of time when a 9 kHz sinusoidal signal is input to the A/D converter.

Switch-frequency components are observed at n times 1 MHz, where n=1, 2, 3, 4, etc.

Figure 25:
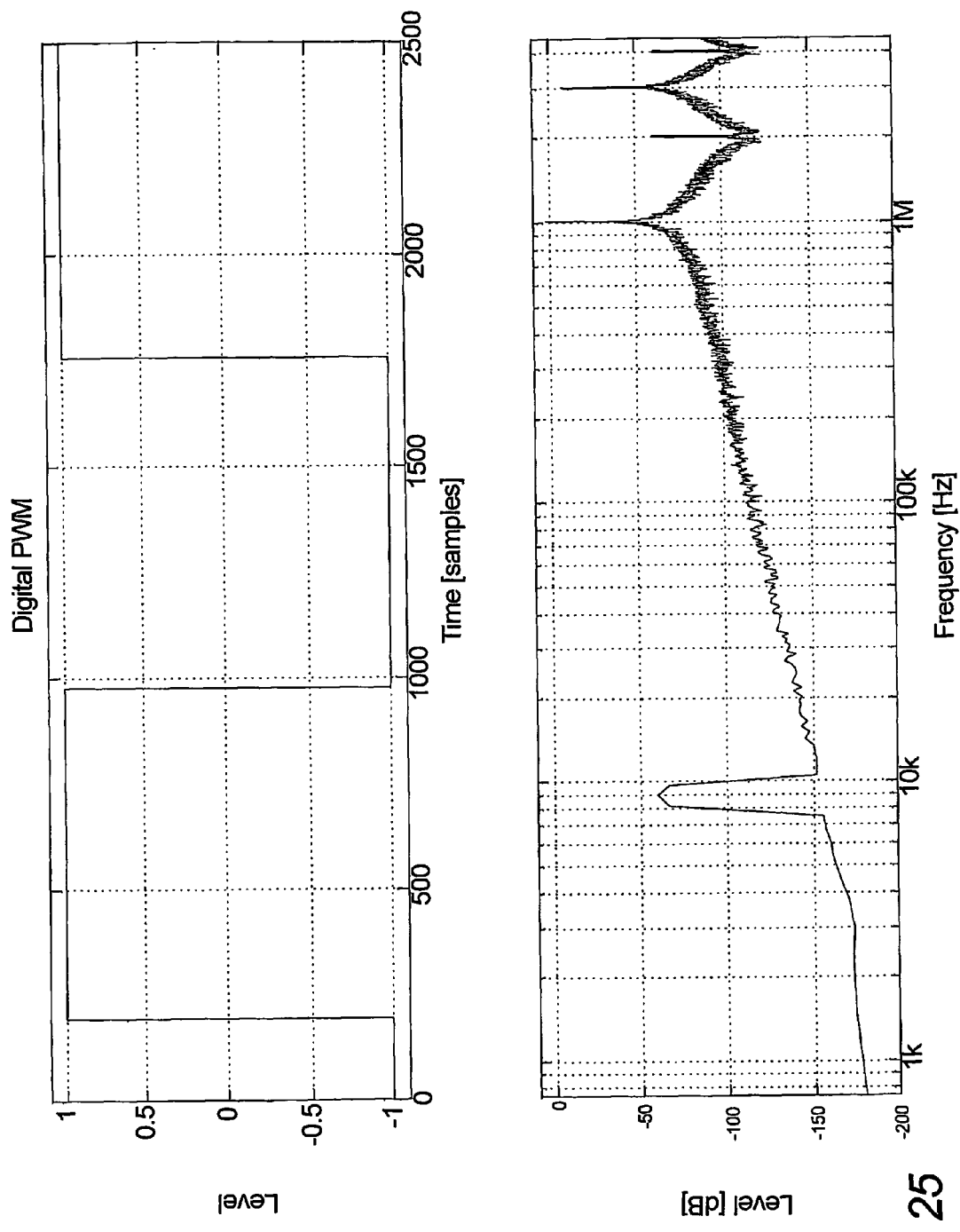
FIG. 25 illustrates the characteristics of a two-level digital pulse width modulator.

FIG. 25 illustrates the characteristics of a two-level digital PWM modulator according to an embodiment of the invention. The illustrated embodiment shows an exemplary two-level PWM modulation signal as a function of time when a 9 kHz sinusoidal signal is input to the A/D converter. The improved suppression of noise in the utility band as observed in connection with FIG. 8a is also noted in this connection.

It is noted that the seven-level PWM modulator benefits from an improved noise suppression compared to the two-level embodiment and the noise floor is thus 20 dB lower than two-level within the utility band, here 0 to 20 kHz. The noise suppression obtained by multi-level PWM is thus significant, although the method requires a high-speed and high-quality D/A converter in the self-oscillating loop.

Figure 30:
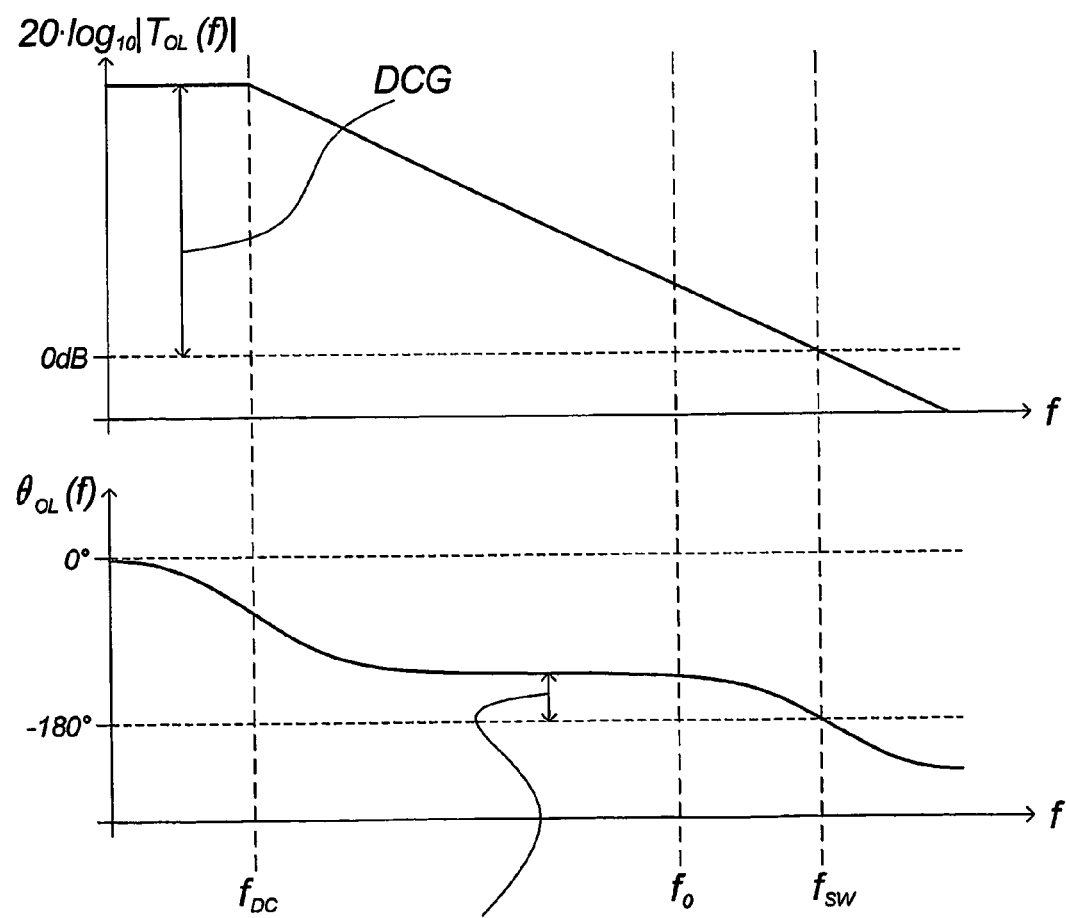
FIG. 30 illustrates ideal gain and phase characteristics for the loop filter.

An ideal frequency response may look like the diagram in FIG. 30. It comprises a logarithmic gain characteristic and a phase shift characteristic of the transfer function of the open loop, $T_{OL}(S)$ of a self-oscillating circuit. The gain characteristic is shown with asymptotic curves. The frequency axes are logarithmic.

Vertical, dashed lines indicate three specific frequencies, a low frequency $f_{DC}$, the upper frequency $f_0$ of the utility frequency band and the higher switch frequency $f_{SW}$ that drives the PWM modulation. The gain characteristic is shown to have a flat gain DCG from 0 Hz to the low frequency $f_{DC}$ where it then rolls off. Due to the self-oscillation it intersects with 0 dB at the switch frequency $f_{SW}$. As the DC gain DCG is desired to be as high as possible to obtain the best noise suppression, and it is always 0 dB at the switching frequency $f_{SW}$ the slope of the rolling off gain characteristic determines the interval between the two frequencies. Thus, the higher the switch frequency is in relation to the low frequency $f_{DC}$ and the steeper the gain slope, the higher DC gain DCG is obtainable.

As a desired DC gain DCG is often specified beforehand due to a need or desire of a specific signal/noise ratio, the last parameters, the slope and nature of the roll off and the position of the low frequency $f_{DC}$ and the switch frequency $f_{SW}$ have to achieve this. As they are tightly bound to each other their determination is often a balancing. A relatively low switch frequency $f_{SW}$ may reduce the demands on the non-linearity or comparator, a possible switch mode amplifier, and the other components in the loop but on the other hand it will require higher ordered filtering means to create a steeper gain roll off. On the other hand, a gently decreasing gain requires a high switch frequency $f_{SW}$ but there is often an upper limit to that frequency as especially the switch mode amplifier but also other components introduce an intolerable high amount of noise to signals above a certain frequency.

The phase shift characteristic shown in FIG. 30 illustrates the boundaries that the phase shift of an open loop characteristic of a self-oscillating circuit should observe. At frequencies below the switch frequency $f_{SW}$ including the utility frequency band the phase shift should be above −180°, at the switch frequency the phase shift characteristic intersects with −180° and at higher frequencies assumes a value below −180°. The angle that lacks in order for the phase shift to be −180° within the utility frequency band is denoted utility band phase margin UPM. This should be as small as possible at as low a frequency as possible in order to obtain the steepest possible gain slope and the earliest possible gain roll off, respectively. Practically, there is however a minimum utility band phase margin UPM in order to ensure stability for all frequencies below the switch frequency $f_{SW}$. This minimum phase margin varies for different embodiments and depends e.g. on the robustness of the circuit, the kind of input signal, the component quality, etc. In a preferred embodiment of the invention, the minimum phase margin is 10° to 20°. In order to obtain a circuit with a relatively small phase margin a relatively high order filtering means with properly positioned filter poles and filter zeroes are required.

The phase characteristic may be controlled by means of delays, filtering means, etc. The comparator means introduce a small delay. To control the phase, i.e. ensuring self-oscillation at the right frequency, filtering means have to be adapted for that purpose. The higher order of the filtering means, the better the phase may be controlled.

Figure 31A:
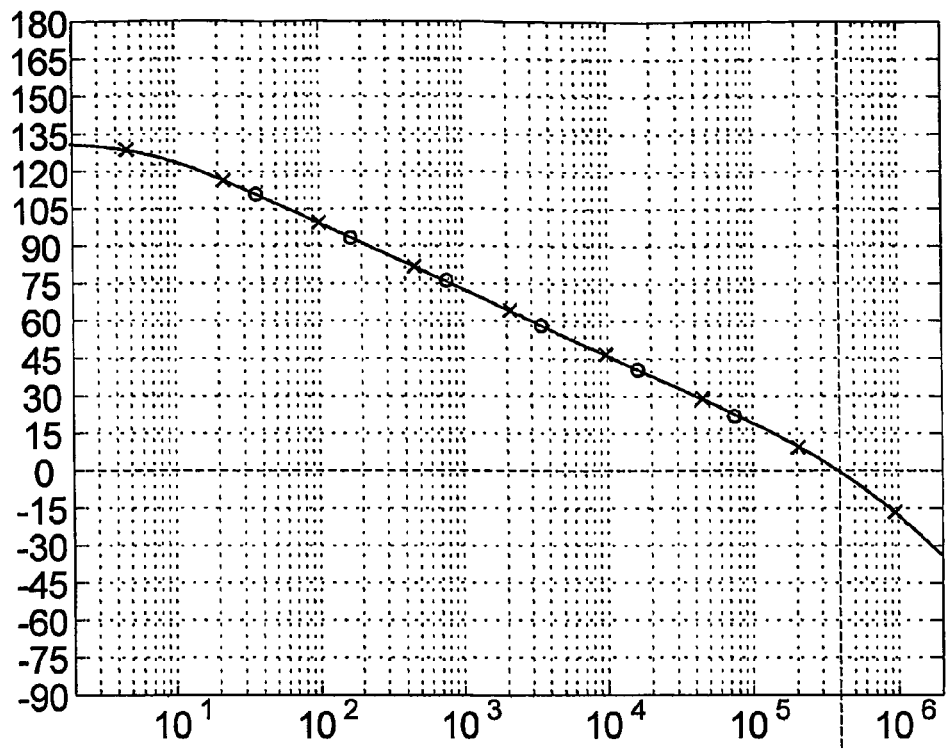
FIG. 31A, 31B, 32A, 32B, 33A, 33B, 34A and 34B illustrates different embodiments of the present invention, and where
Figure 31B:
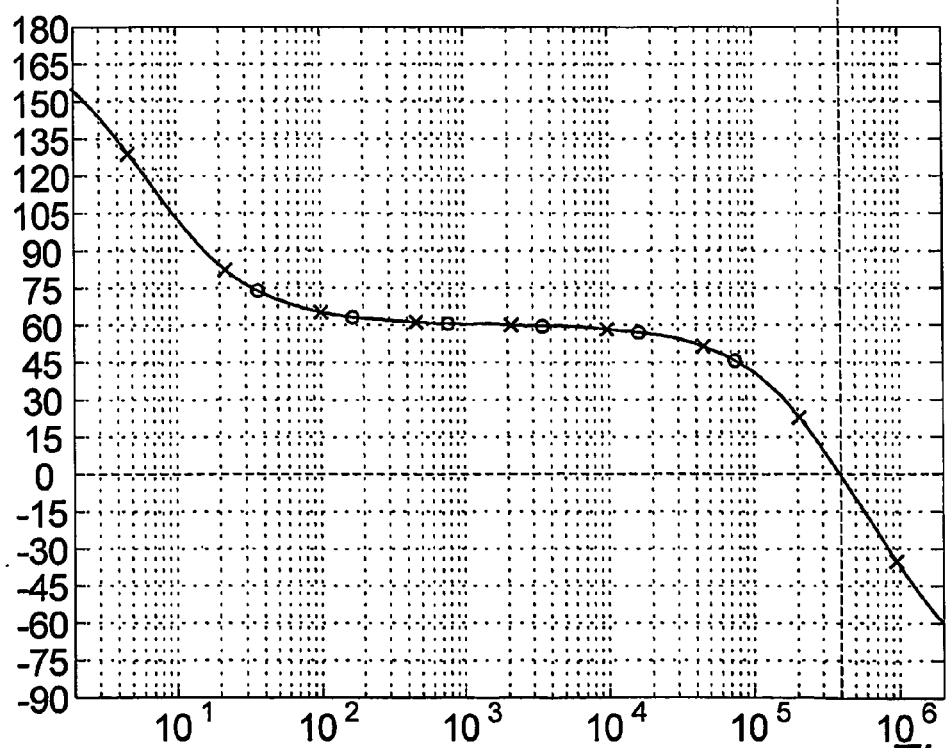

FIG. 31A and 31B illustrate an embodiment of the present invention. FIG. 31A is a logarithmic gain plot of the embodiment where the positions of filter poles and filter zeroes are indicated by means of crosses and circles, respectively. FIG. 31B is a phase margin plot according to the gain plot of FIG. 31A. The filter poles and filter zeroes are also indicated on this plot though positioned at the same frequencies as in FIG. 31A.

As seen, the gain curve intersects with 0 dB at 400 kHz and the phase margin is for that frequency accordingly 0°. Thus, this frequency is the switch frequency of this example embodiment. The present embodiment comprises nine filter poles and six filter zeroes and is thus a ninth order system. The six filter zeroes are paired to the second to seventh filter poles and spaced a little to the left of each corresponding pole. Because of the high order, a relatively flat phase margin curve and a relatively linear negative gain slope is achieved for most of the utility frequency band which in this embodiment is the audio band. The phase margin in the utility band decreases to 60° corresponding to a phase shift of −120° and the slope of the gain curve is about −25 dB per decade. The linear gain slope and flat phase margin in the utility band resembles the curves of a first order or second order filter except that the gain slope of a first order filter would be −20 dB per decade and the phase margin 90° and of a second order filter would be −40 dB per decade and 0°. Thus, the present embodiment performs better than a simple first order system because of steeper slope and smaller phase margin without becoming a second order system which would be unstable at low frequencies. The utility band of the present embodiment may be described as having an effective order of −25 dB/−20 dB=1,25.

With the embodiment of FIG. 31A and 31B, an open loop gain of about 130 dB at DC and 70 dB at 1 kHz is obtained.

Figure 32A:
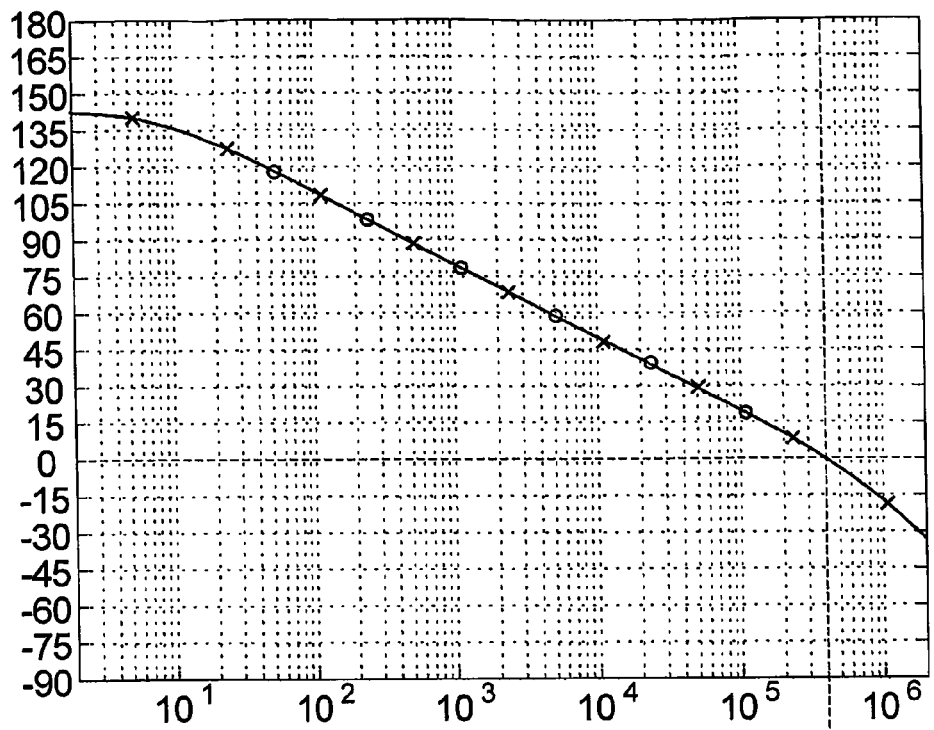
Figure 32B:
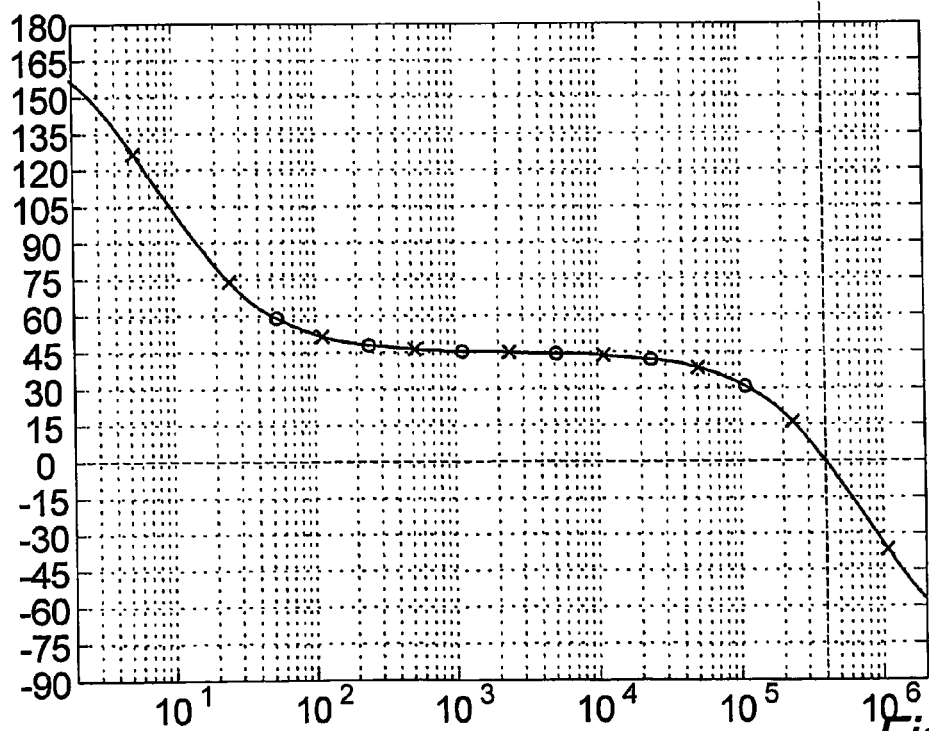

FIG. 32A and 32B illustrate a further embodiment of the present invention. FIG. 32A is a logarithmic gain plot of the embodiment where the positions of filter poles and filter zeroes are indicated by means of crosses and circles, respectively. FIG. 32B is a phase margin plot according to the gain plot of FIG. 32A. The filter poles and filter zeroes are also indicated on this plot though positioned at the same frequencies as in FIG. 32A.

As with the embodiment of FIG. 31A and 31B the switch frequency of this example embodiment is 400 kHz. The present embodiment again comprises nine filter poles and six filter zeroes and is thus again a ninth order system. The six filter zeroes are again paired to the second to seventh filter poles but are in this embodiment spaced a little longer to the left of each corresponding pole than with the embodiment of FIG. 31A and 31B. Again, because of the high order, a relatively flat phase margin curve and a relatively linear negative gain slope are achieved for most of the utility frequency band which in this embodiment is the audio band. The phase margin in the utility band decreases to 45° corresponding to a phase shift of −135° and the slope of the gain curve is about −30 dB per decade. The utility band of the present embodiment may be described as having an effective order of −30 dB/−20 dB=1,5.

With the embodiment of FIG. 32A and 32B, an open loop gain of about 140 dB at DC and 80 dB at 1 kHz is obtained.

Figure 33A:
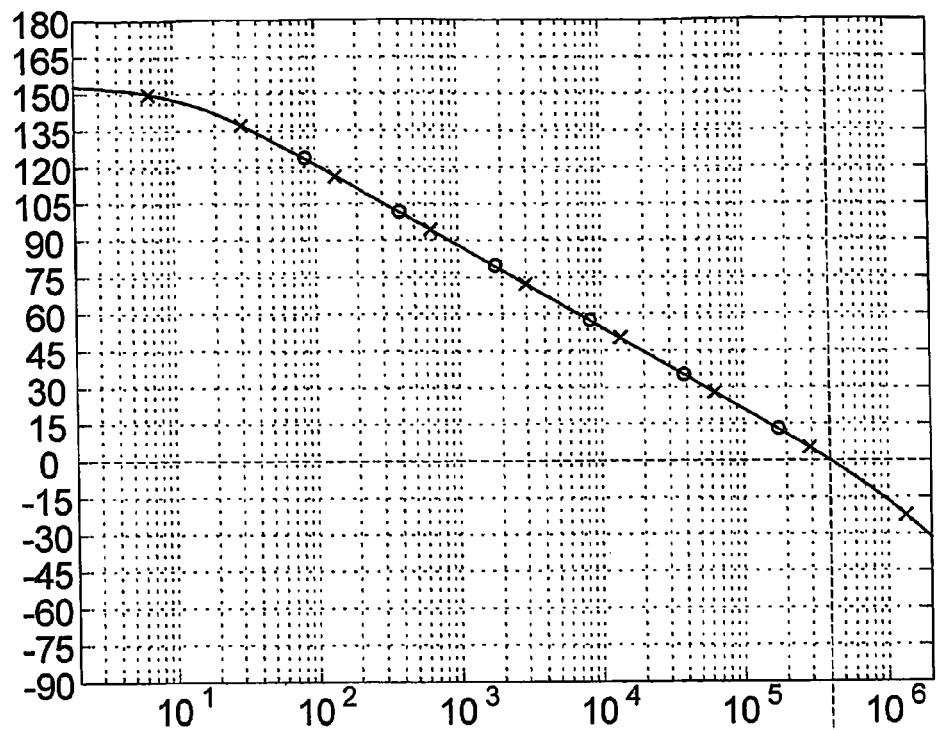
Figure 33B:
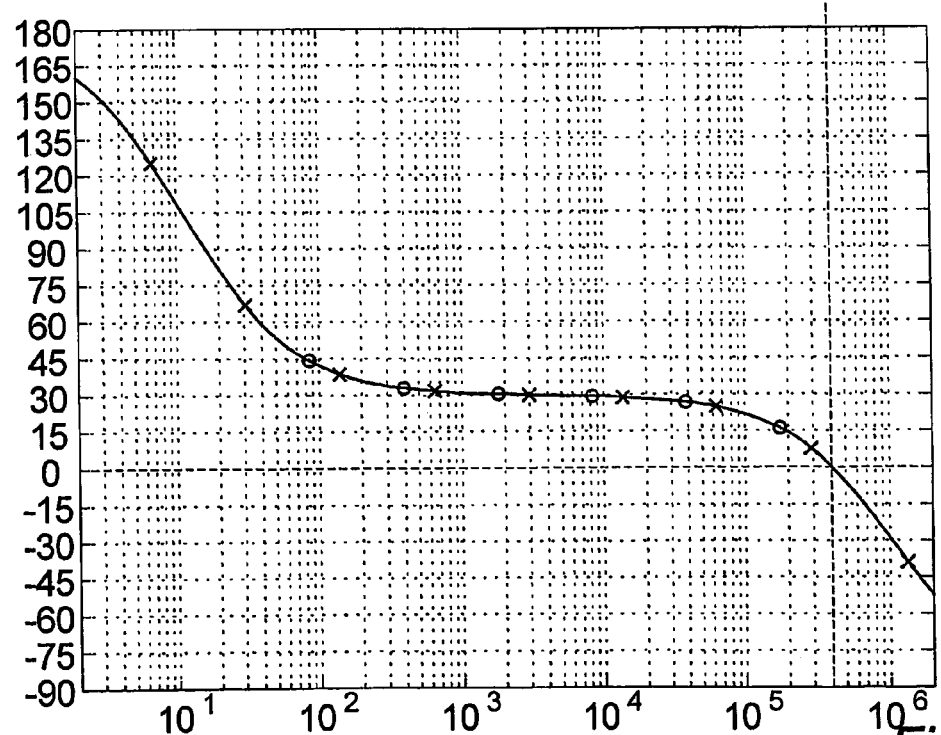

FIG. 33A and 33B illustrate a preferred embodiment of the present invention. FIG. 33A is a logarithmic gain plot of the embodiment where the positions of filter poles and filter zeroes are indicated by means of crosses and circles, respectively. FIG. 33B is a phase margin plot according to the gain plot of FIG. 33A. The filter poles and filter zeroes are also indicated on this plot though positioned at the same frequencies as in FIG. 8A.

As with the embodiment of FIG. 31A and 31B and of FIG. 32A and 32B, the switch frequency of this exemplary embodiment is 400 kHz. The present embodiment again comprises nine filter poles and six filter zeroes and is thus again a ninth order system. The six filter zeroes are again paired to the second to seventh filter poles but are in this embodiment spaced even more to the left of each corresponding pole than with the embodiment of FIG. 32A and 32B. Again because of the high order a relatively flat phase margin curve and a relatively linear negative gain slope is achieved for most of the utility frequency band which in this embodiment is the audio band. The phase margin in the utility band decreases to 30° corresponding to a phase shift of −150° and the slope of the gain curve is about −35 dB per decade. The utility band of the present embodiment may be described as having an effective order of −35 dB/−20 dB=1,75.

With the embodiment of FIG. 33A and 33B, an open loop gain of more than 150 dB at DC and almost 90 dB at 1 kHz is obtained.

Figure 34A:
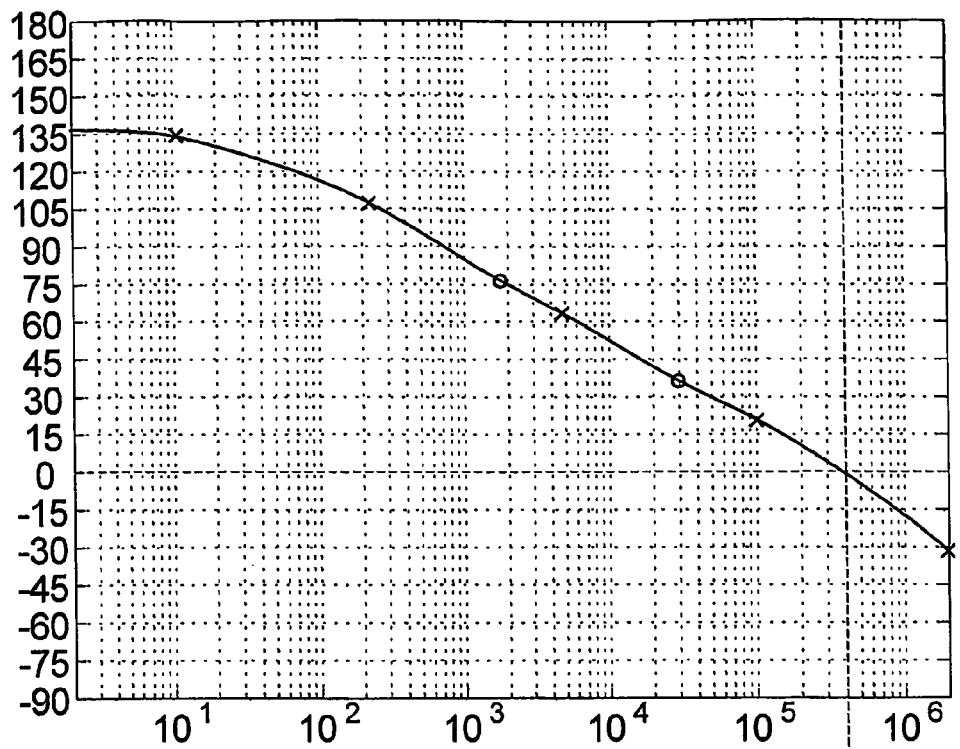
Figure 34B:
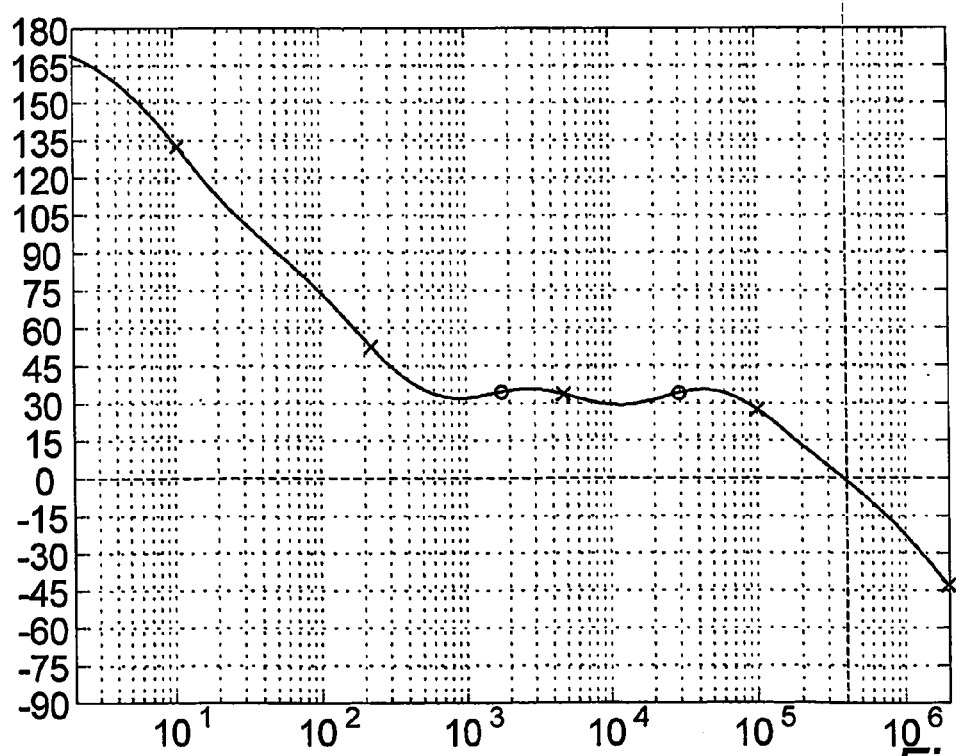

FIG. 34A and 34B illustrate an even further embodiment of the present invention. FIG. 34A is a logarithmic gain plot of the embodiment where the positions of filter poles and filter zeroes are indicated by means of crosses and circles, respectively. FIG. 34B is a phase margin plot according to the gain plot of FIG. 34A. The filter poles and filter zeroes are also indicated on this plot though positioned at the same frequencies as in FIG. 34A.

As with the embodiment of FIG. 31A and 31B and of FIG. 32A and 32B, the switch frequency of this exemplary embodiment is 400 kHz. However, the present embodiment only comprises five filter poles and two filter zeroes and is thus a fifth order system. The two filter zeroes are paired to the second and third filter poles, and are in this embodiment spaced relative far to the left of each corresponding pole. Because of the lower order, relative to the three above-described embodiments the phase margin curve does not become flat though it fluctuates around an average value and the gain slope is not quite linear. The phase margin in the utility band decreases to an average value of about 35° corresponding to a phase shift of −145°.

With the embodiment of FIG. 34A and 34B, an open loop gain of about 135 dB at DC and about 80 dB at 1 kHz is obtained.

Figure 26A:
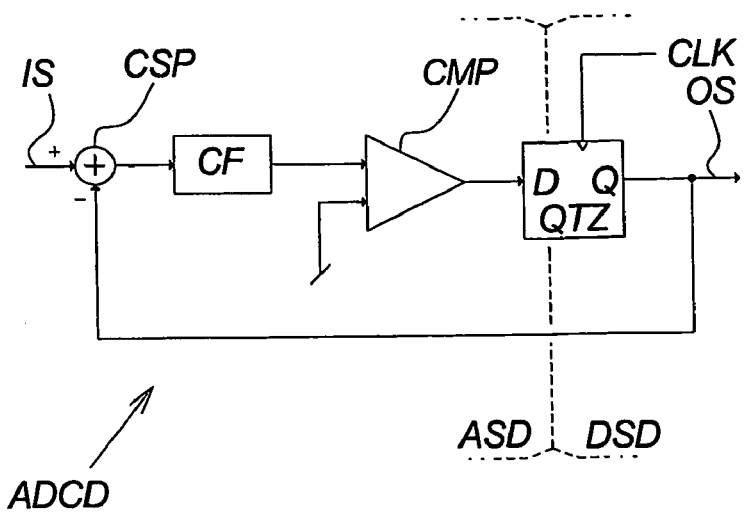
FIG. 26A-26C illustrates embodiments of bouncing controlling, FIG. 28A-28B
Figure 26B:
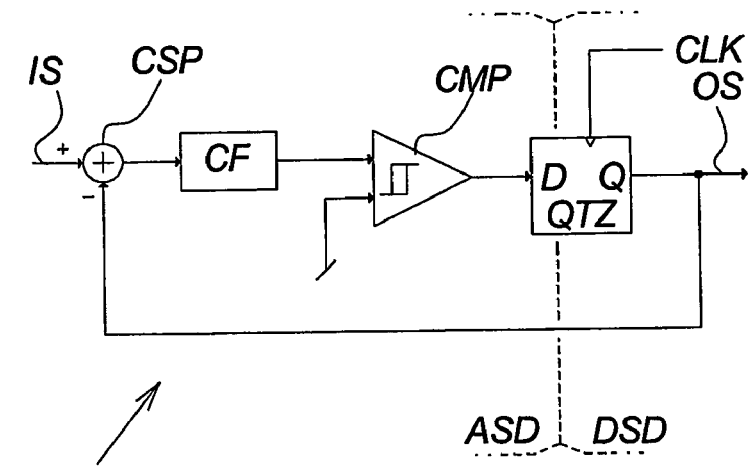
Figure 26C:
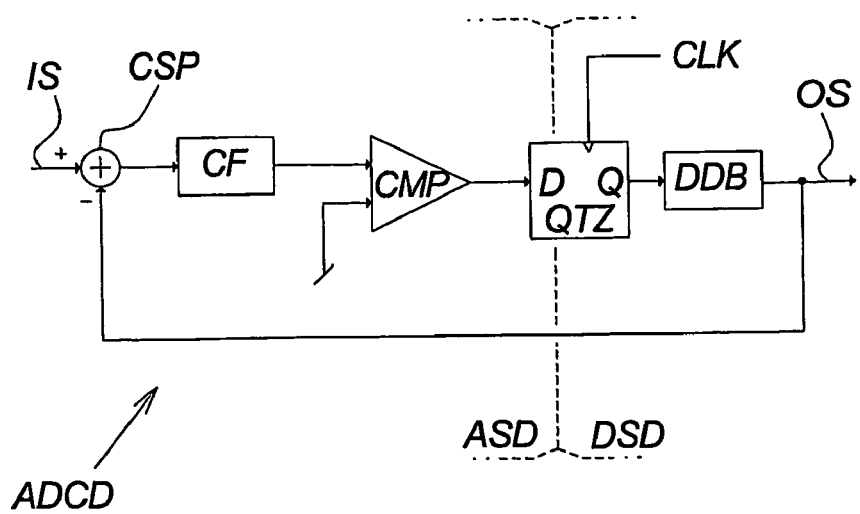

FIG. 26A to 26C illustrates embodiments of the present invention comprising different degrees of and methods for avoiding bouncing, i.e. several narrow pulses or undefined values, around the edges of the digitalized PWM-pulses. In principle such bouncing is not necessarily a problem, but concerning any, preferably digital, processing subsequent to the A/D-conversion, a clean PWM pulse train output is preferable.

FIG. 26A is principally equal to FIG. 8A described above. It comprises an input signal IS fed to a loop filter CF through a summing point CSP, and again fed to a non-linearity CMP, in this example embodied by a comparator. The output of the non-linearity is preferably a PWM representation of the input signal IS, and is digitalized by means of a quantizer QTZ. The output signal OS of the quantizer is fed back to the summing point CSP. The embodiment of FIG. 26A comprises no particular means for avoiding bouncing, and hence comprises substantially no hysteresis.

The non-linearity CMP of the embodiment of FIG. 26A may comprise, e.g., a limiter, a comparator, an operational amplifier, etc.

The loop filter CF of the embodiment of FIG. 26A may be of several different kinds, as long as it facilitates self-oscillation by contributing to the phase of the input signal by approximately −180° at the desired switch frequency. This requirement causes only loop filters of at least second order to be applicable.

Figure 28A:
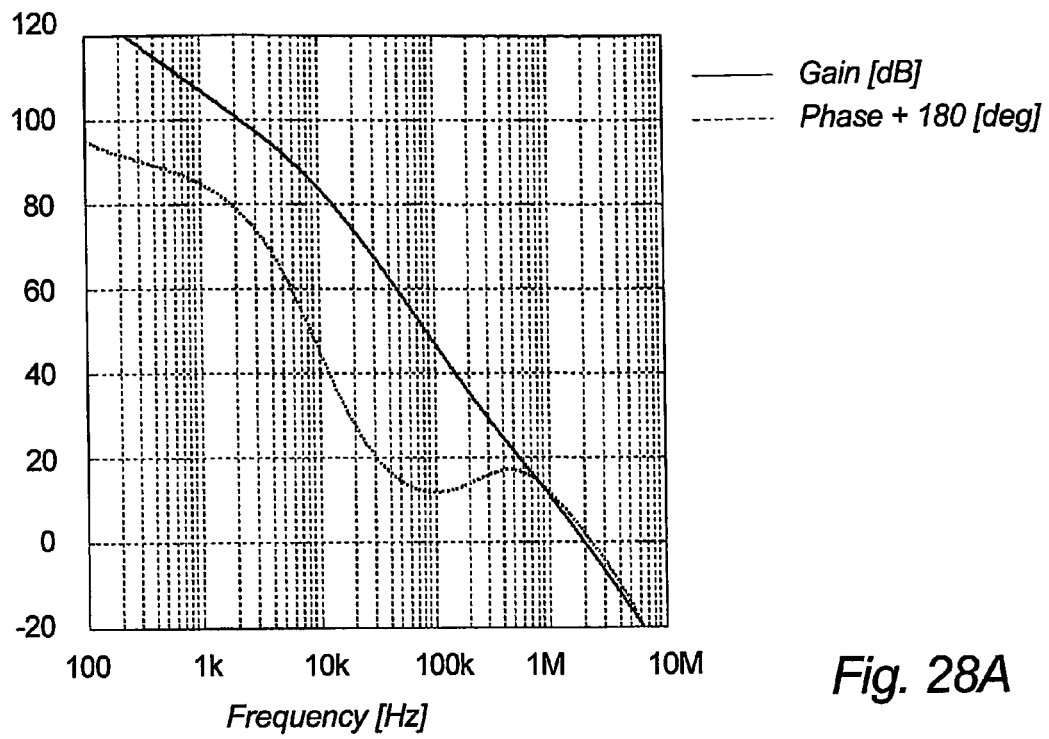
Figure 28B:
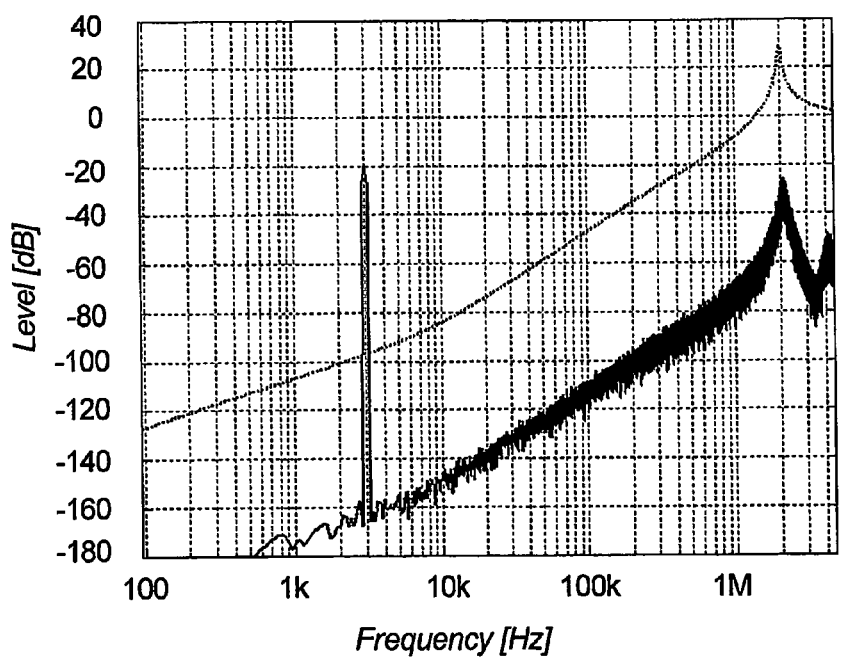

FIG. 28A and 28B illustrate the noise-suppression obtainable from a specific implementation of the embodiment of FIG. 26A. FIG. 28A shows the filter characteristic, i.e. gain and phase characteristics of a second order filter comprising poles at the frequencies 10 Hz, 10 kHz and 750 kHz, and a single zero at 400 kHz. The filter is normalized so that its gain is 0 dB at the desired switch frequency of 2 MHz. In a real implementation the gain should facilitate a small output amplitude, e.g. 200 mV peak-to-peak, to avoid slew-rate problems.

The filter gain-characteristic shows that the slope for frequencies above the common audio band of 20 kHz is almost −40 dB per decade, and the phase characteristic shows that the phase margin becomes 20° at 20 kHz and stays below 20° for higher frequencies.

FIG. 28B shows the resulting spectrum of a test signal of 3 kHz being sent through the embodiment of FIG. 26A with the filter characteristic described above with reference to FIG. 28A. The dotted line illustrates the noise-suppressing characteristic derived from the filter characteristic H(s) as $(H(s)+1)^{-1}$. The output signal spectrum obviously follows the error-suppression characteristic. The 3 kHz test input signal is visible as a significant peak at 3 kHz with approximately 140 dB suppression of the surrounding noise.

FIG. 26B shows an embodiment of the present invention almost equal to the embodiment of FIG. 26A, but where hysteresis is implemented in the non-linearity CMP in order to avoid bouncing. The hysteresis may be implemented in several different ways, whereof one possible method comprises adding resistors coupled in connection with the non-linearity CM, and thereby causing positive feedback from the output of the comparator to one of its inputs, and controllable by adjusting the resistors relative to each other.

Applying hysteresis within a self-oscillating loop as, e.g., the embodiment of FIG. 26B causes an additional loop delay to be introduced, and thereby a contribution to the phase. Again, such a contribution causes the switch frequency to move, or even causes the system to be uncontrollably unstable. As the non-linear nature of the hysteresis loop delay causes it to contribute to the phase without contributing to the gain characteristic of the loop, and as the total phase contribution within the loop must not exceed −180° at a frequency lower than the desired switch frequency, the hysteresis actually restricts the possible loop filter implementations, by e.g. restricting the obtainable low frequency gain. It is therefore desirable to implement the least possible hysteresis, in order to allow the best possible loop filter characteristic.

Figure 29A:
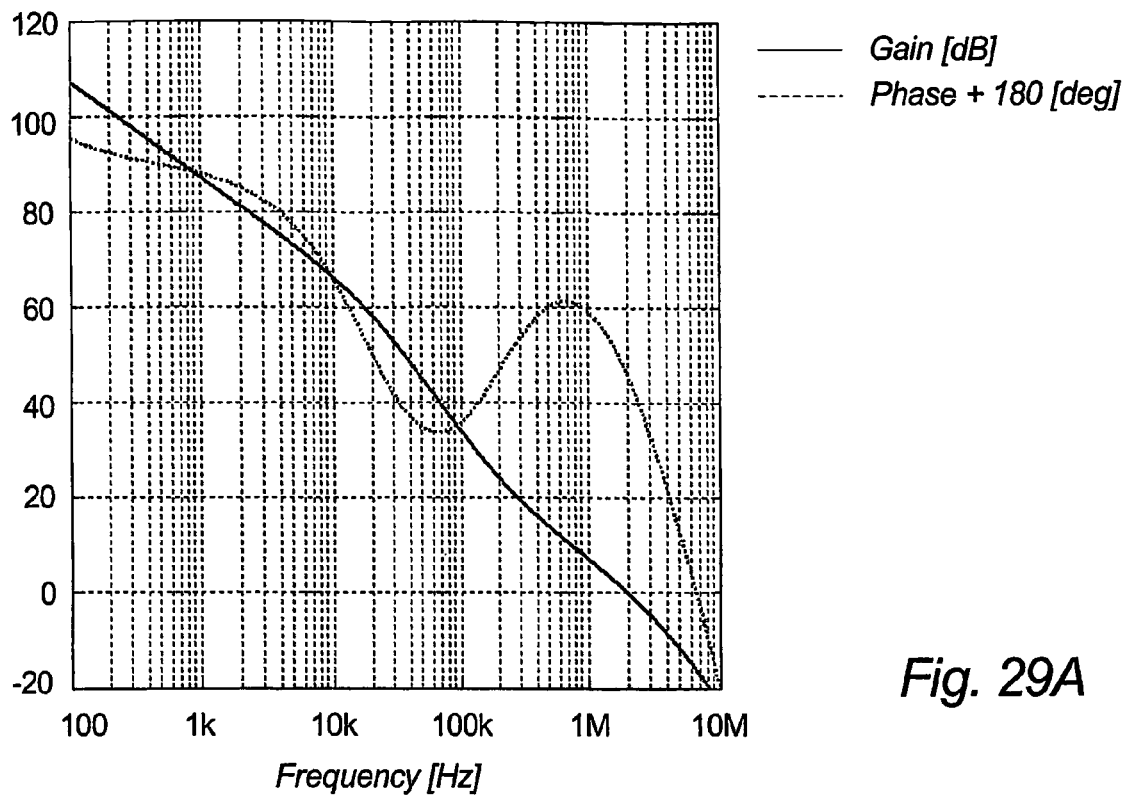
FIG. 29A-29B illustrates signal spectrums resulting from the embodiments of FIGS. 26A and 26B.
Figure 29B:
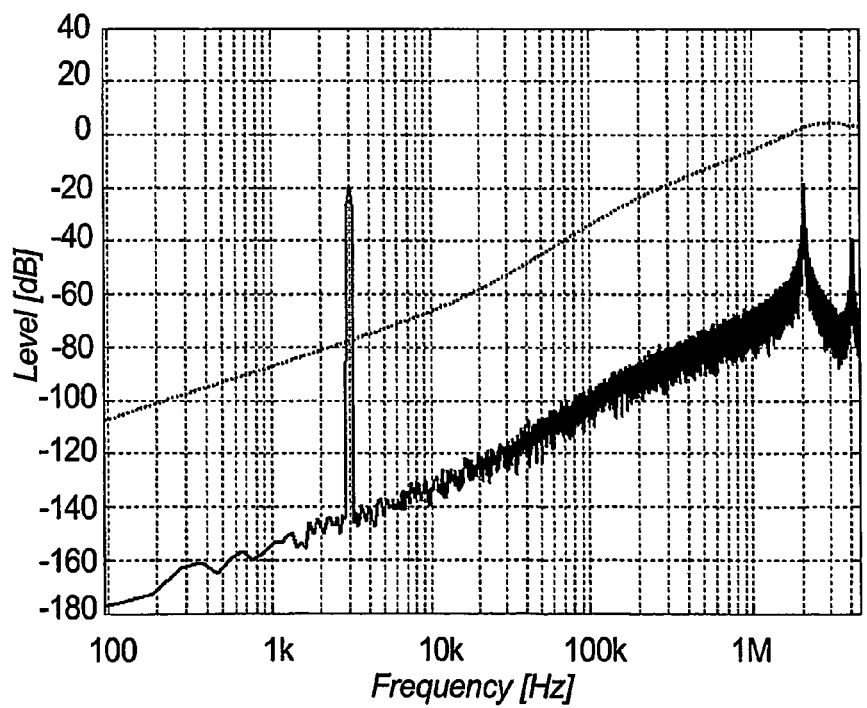

FIG. 29A and 29B correspond in principle to FIG. 28A and 28B described above, but this time according to an embodiment of FIG. 26B comprising hysteresis. The applied hysteresis is designed such that it contributes with approximately −45° to the phase at the desired switch frequency of 2 MHz. This is in most situations far more hysteresis than needed, but better shows the principle. In order to allow this hysteresis, the loop filter must be changed to avoid a total phase contribution that exceeds −180° at a frequency lower than the desired switch frequency. The loop filter implemented for the examples of FIGS. 29A and 29B is still a second order filter but now comprises poles at 10 Hz, 20 kHz and 3.3 MHz, and a single zero at 200 kHz.

The filter gain-characteristic shows that the slope for frequencies above the common audio band of 20 kHz is now somewhat less than −40 dB per decade, approximately −30 to −35 dB per decade, and the phase characteristic shows that the phase margin is approximately 50° at 20 kHz, but even rises to 60° before it eventually drops.

FIG. 29B shows the resulting spectrum of a test signal of 3 kHz being sent through the embodiment of FIG. 26B with the filter characteristic described above with reference to FIG. 29A. The dotted line illustrates the noise-suppressing characteristic derived from the filter characteristic H(s) as $(H(s)+1)^{-1}$. The output signal spectrum obviously follows the error-suppression characteristic. The 3 kHz test input signal is visible as a significant peak at 3 kHz with approximately 120 dB suppression of the surrounding noise, which is 20 dB less suppression than with the embodiment of FIG. 26A.

If the hysteresis contribute by approximately 90° or more to the phase, the loop filter has to be a first order filter, or at least have an effective order of 1 or less, and this will cause a significant performance drop compared to the obtainable results with low hysteresis or no hysteresis at all. Therefore the phase contribution of hysteresis in the non-linearity of the self-oscillating loop should at the switch frequency be less than 90°, more preferably less than 40°, more preferably less than 20° and most preferably less than 10°.

FIG. 26C illustrates an embodiment almost equal to FIG. 26A, but in addition thereto comprises a digital debouncer DDB. This is a mechanism for removing the results of bouncing which is implemented in the digital domain, and therefore in principle do not contribute to either the gain or phase characteristics of the loop. In a real implementation it will however cause a small, typically insignificant, delay.

Variants within the scope of the invention include the use of more than one feedback for the purpose of establishing the desired self-oscillating properties, i.e. a PWM modulation of an input signal. Further variations of the invention include the use of a switch frequency stabilizing circuits, e.g. variable references applied for the purpose of fixing the switch-frequency within a tolerable interval.

Further variants within the scope of the invention may include, but are not limited to, the inclusion of further circuitry, such as oscillators, power supplies, etc, in the A/D-converter.

The invention claimed is:

1. A/D converter comprising a self-oscillating modulator, said converter comprising
   at least one self-oscillating loop comprising
      at least one forward path,
      at least one feedback path,
   wherein said at least one forward path comprises amplitude quantizing means combined with time quantizing means and outputting at least one time and amplitude quantized signal,
   wherein an error originating from at least one time quantizer included in the at least one self-oscillating loop of the converter is suppressed by an error transfer function which, at low frequencies approximates an inverse of an open-loop transfer function of said at least one self-oscillating loop,
   wherein the modulator switches with a switch frequency which is at least partly defined by the at least one self oscillating loop, and
   wherein the switch frequency is at least 100 kHz.

2. A/D converter comprising a self-oscillating modulator according to claim 1, wherein said time quantizing means is arranged within said self-oscillating loop.

3. A/D converter comprising a self-oscillating modulator according to claim 1, wherein said time quantizing means comprises a high-speed sampling means.

4. A/D converter comprising a self-oscillating modulator according to claim 1, wherein said time quantizing means comprises a high-speed one-bit sampler.

5. A/D converter comprising a self-oscillating modulator according to claim 1, wherein said time quantizing means comprises latch-based circuitry comprising at least one latch, preferably at least two cascaded latches.

6. A/D converter comprising a self-oscillating modulator according to claim 1, wherein said amplitude quantizing means and said time quantizing means comprises a multi-bit A/D converter and where said feedback path comprises at least one D/A converter adapted for converting said time quantized signal into an analogue signal.

7. A/D converter comprising a self-oscillating modulator according to claim 1, wherein said down sampling means are connected to said time quantizing means.

8. A/D converter comprising a self-oscillating modulator according to claim 1, wherein said A/D converter comprises two or more self-oscillating loops (SOL).

9. A/D converter comprising a self-oscillating modulator according to claim 1, wherein said amplitude and time quantizing means comprises an analogue two-level self-oscillating pulse width modulator.

10. A/D converter comprising a self-oscillating modulator according to claim 1, wherein said amplitude and time quantizing means comprises a multi-level self-oscillating pulse width modulator.

11. A/D converter comprising a self-oscillating modulator according to claim 1, wherein said A/D converter is single-ended.

12. A/D converter comprising a self-oscillating modulator according to claim 1, wherein said A/D converter is differential.

13. A/D converter comprising a self-oscillating modulator according to claim 1, wherein said A/D converter comprises filtering means, said filtering means adapted for band pass filtering the time quantized signal.

14. A/D converter comprising a self-oscillating modulator according to claim 1, wherein an error originating from at least one time quantizer included in the at least one self-oscillating loop of the converter is suppressed by an error transfer function which, at high frequencies approximates 0 dB.

15. A/D converter comprising a self-oscillating modulator according to claim 1, wherein said amplitude quantizing means comprises a limiter.

16. A/D converter comprising a self-oscillating modulator according to claim 1, wherein said amplitude quantizing means comprises a frequency compensated limiter.

17. A/D converter comprising a self-oscillating modulator according to claim 1, wherein a variable self-oscillating loop delay is applied.

18. A/D converter according to claim 1, wherein said A/D converter comprises switch frequency control means.

19. A/D converter according to claim 18, wherein said switch frequency control means comprises a variable delay in said at least one self oscillating loop.

20. A/D converter according to claim 18, wherein said switch frequency control means comprises an additional periodic signal generator connected to the self oscillating loop.

21. A/D converter according to claim 18, wherein said switch frequency control means comprises an oscillator or a derivative of a clock frequency.

22. A/D converter according to claim 1, wherein said at least one forward path comprises a non-linearity.

23. A/D converter according to claim 22, wherein said non-linearity comprises a limiter.

24. A/D converter according to claim 22, wherein said non-linearity comprises a frequency compensated limiter.

25. A/D converter according to claim 22, wherein said non-linearity comprises a comparator.

26. A/D converter according to claim 22, wherein said non-linearity comprises a operational amplifier.

27. A/D converter according to claim 22, wherein phase contribution of hysteresis in the non-linearity of the self-oscillating loop is less than 90°, preferably less than 40° at a switch frequency.

28. A/D converter according to claim 22, wherein phase contribution of hysteresis in the non-linearity of the self-oscillating loop at switch frequency is less than 20°, preferably less than 10°.

29. A/D converter according to claim 1, wherein said at least one forward path and said at least one feedback path forms at least one self-oscillating loop.

30. A/D converter according to claim 1, wherein said self-oscillating loop forms a pulse width modulator and wherein the modulation of an analog input signal fed to the at least one forward path is pulse width modulated at least partly by oscillations established in said at least one self-oscillating loop.

31. A/D converter according to claim 1, wherein said self-oscillating modulator comprises at least one analog input connected to said forward path and wherein an output of said forward path is connected to a digital output.

32. A/D converter according to claim 1, wherein a transfer functions H(s) is inserted in the forward path, thereby at least partly controlling a switch-frequency.

33. A/D converter according to claim 32, wherein the order of said transfer functions is at least one.

34. A/D converter according to claim 32, wherein the order of said transfer functions is at least two.

35. A/D converter according to any of the claim 32, wherein the effective order of said transfer functions is at least one, preferably substantially two.

36. A/D converter according to claim 1, wherein said A/D converter comprises an audio A/D-converter.

37. A/D converter according to claim 1, wherein a clock frequency of the time quantizing means is at least 10 (ten) times greater than a switch frequency of said at least one self-oscillating loop, preferably at least 100 (hundred) times greater.

38. A/D converter according to claim 1, wherein said quantization in a time domain is performed within said at least one self-oscillating loop.

39. A/D converter according to claim 1, wherein said A/D further comprises at least one decimator communicating with digital output.

40. A/D converter according to claim 39, wherein said decimator comprises an anti aliasing filter having an impulse response which is longer than a period of the pulse width modulated signal, preferably at least longer than three times the period of the pulse width modulated signal.

41. A/D converter according to claim 40, wherein a stopband attenuation of the underlying antialiasing filter of the decimator is be greater than 60 dB, preferably greater than 100 dB.

42. A/D converter according to claim 41, wherein the stopband of the antialiasing filter is:

Stopband $=k \cdot fs_{out} \pm BW$, where $k=1,2,3, \ldots$ until the Nyquist frequency is reached, $fs_{out}$ is the output rate of the decimator and BW is the utility bandwidth, typically preferably at least 20 kHz.

43. Method of modulating an analog input signal into a pulse width modulated digital signal, whereby said analog input signal is modulated into a modulated representation by means of at least one self-oscillating loop
said self-oscillating loop comprising
at least one forward path,
at least one feedback path, wherein said at least one forward path comprises amplitude quantizing means combined with time quantizing means and outputting at least one time and amplitude quantized signal, wherein an error originating from at least one time quantizer included in the at least one self-oscillating loop of the converter is suppressed by an error transfer function which, at low frequencies approximates an inverse of an open-loop transfer function of said at least one self-oscillating loop, and wherein the modulator switches with a switch frequency that is at least 100 kHz.

44. Method of pulse width modulating an analog input signal according to claim 43, wherein said analog signal comprises an audio or audio derived signal.

45. Method of pulse width modulating an analog input signal according to claim 43, whereby the method comprises the steps of representing a pulse width modulated representation as an analogue signal and quantizing the pulse width modulation in the time-domain and whereby said pulse width modulated representation is obtained by means of at least one self-oscillating modulator comprising at least one self-oscillating loop.

46. Method of pulse width modulating an analog input signal according to claim 43, wherein A/D converter switches with a switch frequency which is at least partly defined by the at least one self oscillating loop.

47. Method of pulse width modulating an analog input signal according to claim 46, wherein a clock frequency of the time quantizing means is at least 10 (ten) times greater than the switch frequency of said at least one self-oscillating loop, preferably at least 100 (hundred) times greater.

48. Method of pulse width modulating an analog input signal according to claim 43, wherein said method is performed in an audio A/D converter.

49. Method according to claims 46, whereby said method is applied in an A/D converter wherein said time quantizing means comprises at least one of an arrangement arranged within said self-oscillating loop, a high-speed sampling means, and a high-speed one-bit sampler.

* * * * *